US012751006B2

(12) United States Patent
Lee et al.

(10) Patent No.: US 12,751,006 B2
(45) Date of Patent: Sep. 29, 2026

(54) INTEGRATED CIRCUIT DEVICE AND ELECTRONIC SYSTEM INCLUDING THE SAME

(71) Applicant: SAMSUNG ELECTRONICS CO., LTD., Suwon-si (KR)

(72) Inventors: Dongjin Lee, Suwon-si (KR); Junhee Lim, Suwon-si (KR); Hakseon Kim, Suwon-si (KR); Kangoh Yun, Suwon-si (KR); Sohyun Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 281 days.

(21) Appl. No.: 18/602,778

(22) Filed: Mar. 12, 2024

(65) Prior Publication Data

US 2024/0324194 A1 Sep. 26, 2024

(30) Foreign Application Priority Data

Mar. 24, 2023 (KR) ........................ 10-2023-0039162
Mar. 29, 2023 (KR) ........................ 10-2023-0041250

(51) Int. Cl.
*H10B 41/35* (2023.01)
*G11C 16/04* (2006.01)
(Continued)

(52) U.S. Cl.
CPC ......... *H10B 41/35* (2023.02); *G11C 16/0483* (2013.01); *H10B 41/10* (2023.02);
(Continued)

(58) Field of Classification Search
CPC ........ H10B 41/35; H10B 41/10; H10B 41/27; H10B 41/41; H10B 80/00; G11C 16/0483; H10W 90/00; H10D 89/10
See application file for complete search history.

(56) References Cited

U.S. PATENT DOCUMENTS

| | | | |
|---|---|---|---|
| 6,731,540 | B2 | 5/2004 | Lee et al. |
| 10,490,256 | B2 | 11/2019 | Jeong |

(Continued)

FOREIGN PATENT DOCUMENTS

| | | | | |
|---|---|---|---|---|
| CN | 102956690 A | * | 3/2013 | ........... H10D 64/516 |
| CN | 114695353 A | * | 7/2022 | ............. H10B 12/31 |

(Continued)

*Primary Examiner* — Mamadou L Diallo
(74) *Attorney, Agent, or Firm* — Sughrue Mion, PLLC

(57) ABSTRACT

An integrated circuit device includes a substrate including an active region including a central active region, base active regions and extended active regions integrated together and defined by a device isolation film. A drain region is located in the central active region, and source regions are respectively located in the base active regions. The base active regions are spaced apart from each other in different diagonal directions with respect to the central active region in a plan view. The extended active regions each have an L-shape, connect the central active region and the base active regions, and are spaced apart from each other. Gate structures that respectively cross the base active regions and are spaced apart from each other on the substrate. The central active region, the extended active regions, the base active regions, and the gate structures configure pass transistors, and the pass transistors share the drain region.

20 Claims, 22 Drawing Sheets

(51) Int. Cl.

| | |
|---|---|
| ***H10B 41/10*** | (2023.01) |
| ***H10B 41/27*** | (2023.01) |
| ***H10B 41/41*** | (2023.01) |
| ***H10B 80/00*** | (2026.01) |
| ***H10W 90/00*** | (2026.01) |

(52) U.S. Cl.
CPC ............. *H10B 41/27* (2023.02); *H10B 41/41* (2023.02); *H10B 80/00* (2023.02); *H10W 90/00* (2026.01); *H10W 90/752* (2026.01)

(56) References Cited

U.S. PATENT DOCUMENTS

| | | | | |
|---|---|---|---|---|
| 12,615,760 | B2 * | 4/2026 | Zhu | H10B 12/315 |
| 2009/0152614 | A1 * | 6/2009 | Hwang | H10B 69/00<br>257/315 |
| 2015/0060778 | A1 * | 3/2015 | Kim | H10K 59/8793<br>438/23 |
| 2020/0006355 | A1 * | 1/2020 | Chuang | H10B 10/12 |
| 2022/0157960 | A1 * | 5/2022 | Cho | H10D 64/519 |
| 2022/0208787 | A1 * | 6/2022 | Baek | H10B 41/41 |
| 2022/0406801 | A1 * | 12/2022 | Kim | H10B 41/35 |
| 2023/0005936 | A1 * | 1/2023 | Han | G11C 5/025 |
| 2023/0074880 | A1 * | 3/2023 | Park | H10D 64/017 |
| 2023/0378155 | A1 * | 11/2023 | Park | H10D 89/10 |
| 2023/0410909 | A1 * | 12/2023 | Kim | H10B 43/27 |
| 2024/0021266 | A1 * | 1/2024 | Tsai | G11C 29/785 |
| 2024/0032290 | A1 * | 1/2024 | Chern | H10B 41/27 |
| 2024/0096890 | A1 * | 3/2024 | Matsumoto | H10D 30/60 |
| 2024/0212753 | A1 * | 6/2024 | Zhang | G11C 16/0483 |

FOREIGN PATENT DOCUMENTS

| | | | | | |
|---|---|---|---|---|---|
| CN | 115775800 | A | * | 3/2023 | H10P 14/3462 |
| KR | 10-0432884 | B1 | | 5/2004 | |

* cited by examiner

INTEGRATED CIRCUIT DEVICE AND ELECTRONIC SYSTEM INCLUDING THE SAME

CROSS-REFERENCE TO RELATED APPLICATIONS

This application is based on and claims priority under 35 USC § 119 to Korean Patent Application No. 10-2023-0039162, filed on Mar. 24, 2023 and Korea Patent Application No. 10-2023-0041250, filed on Mar. 29, 2023, in the Korean Intellectual Property Office, the disclosures of each which being incorporated by reference herein in their entireties.

BACKGROUND

The present disclosure relates to an integrated circuit (IC) device and an electronic system including the same, and more particularly, to an IC device including a nonvolatile memory device and an electronic system including the same.

Consumers demand IC devices having high performance, small size, and low costs. Therefore, in order to achieve a highly integrated IC device, an IC device including a three-dimensional (3D) nonvolatile memory device in which a plurality of memory cells are arranged in the vertical direction and an electronic system including the same have been proposed.

SUMMARY

It is an aspect to provide an integrated circuit (IC) device having a high degree of integration and improved performance and reliability, and an electronic system including the same.

According to an aspect of one or more embodiments, there is provided an integrated circuit device comprising a substrate including an active region comprising a central active region, at least two base active regions and at least two extended active regions that are integrated together and defined by a device isolation film, a drain region being located in the central active region, source regions being respectively located in the at least two base active regions, the at least two base active regions being spaced apart from each other in different diagonal directions with respect to the central active region in a plan view, wherein the at least two extended active regions each have an L-shape, connect the central active region and the at least two base active regions, and are spaced apart from each other; and at least two gate structures that respectively cross the at least two base active regions, extend in a first horizontal direction, and are spaced apart from each other on the substrate, wherein the central active region, the at least two extended active regions, the at least two base active regions, and the at least two gate structures configure at least two pass transistors, and the at least two pass transistors share the drain region.

According to another aspect of one or more embodiments, there is provided an integrated circuit device comprising a peripheral circuit structure; and a cell array structure including a cell stack structure overlapping the peripheral circuit structure in a vertical direction, the cell stack structure including a plurality of gate electrodes and a plurality of insulating layers alternately stacked on each other and having a step shape. The peripheral circuit structure includes a substrate including an active region in which a central active region, first, second, third, and fourth base active regions, and first, second, third, and fourth extended active regions are integrally formed, the active region being defined by a device isolation film, the first, second, third, and fourth base active regions being spaced apart from each other in different diagonal directions with respect to the central active region in a plan view, and the first, second, third, and fourth extended active regions being spaced apart from each other and connecting the central active region to the first, second, third, and fourth base active regions; and first, second, third, and fourth gate structures that respectively cross the first, second, third, and fourth base active regions, that extend in a first horizontal direction, and that are spaced apart from each other on the substrate, wherein the central active region, the first, second, third, and fourth extended active regions, the first, second, third, and fourth base active regions, and the first, second, third, and fourth gate structures configure first, second, third, and fourth pass transistors electrically connected to the plurality of gate electrodes.

According to yet another aspect of one or more embodiments, there is provided an electronic system comprising a main substrate; an integrated circuit device on the main substrate, the integrated circuit device including a peripheral circuit structure and a cell array structure, wherein the cell array structure includes a cell stack structure that overlaps the peripheral circuit structure in a vertical direction, that includes a plurality of gate electrodes and a plurality of insulating layers alternately stacked on each other, and that has a step shape; and a controller electrically connected to the integrated circuit device on the main substrate. The peripheral circuit structure includes a periphery substrate including an active region in which a central active region, first, second, third, and fourth base active regions, and first, second, third, and fourth extended active regions are integrally formed, a drain region being located in the central active region and first, second, third and fourth source regions being respectively located in the first, second, third and fourth base active regions, the active region being defined by a device isolation film, the first, second, third, and fourth base active regions being arranged and spaced apart from each other in different diagonal directions with respect to the central active region in a plan view, and the first, second, third, and fourth extended active regions connecting the central active region to the first, second, third, and fourth base active regions and being spaced apart from each other; and first, second, third, and fourth gate structures that respectively cross the first, second, third, and fourth base active regions, extend in a first horizontal direction, and are spaced apart from each other on the periphery substrate, wherein the central active region, the first, second, third, and fourth extended active regions, the first, second, third, and fourth base active regions, and the first, second, third, and fourth gate structures configure first, second, third, and fourth pass transistors electrically connected to the plurality of gate electrodes.

BRIEF DESCRIPTION OF THE DRAWINGS

Various embodiments will be more clearly understood from the following detailed description taken in conjunction with the accompanying drawings, in which.

DETAILED DESCRIPTION

Figure 1:
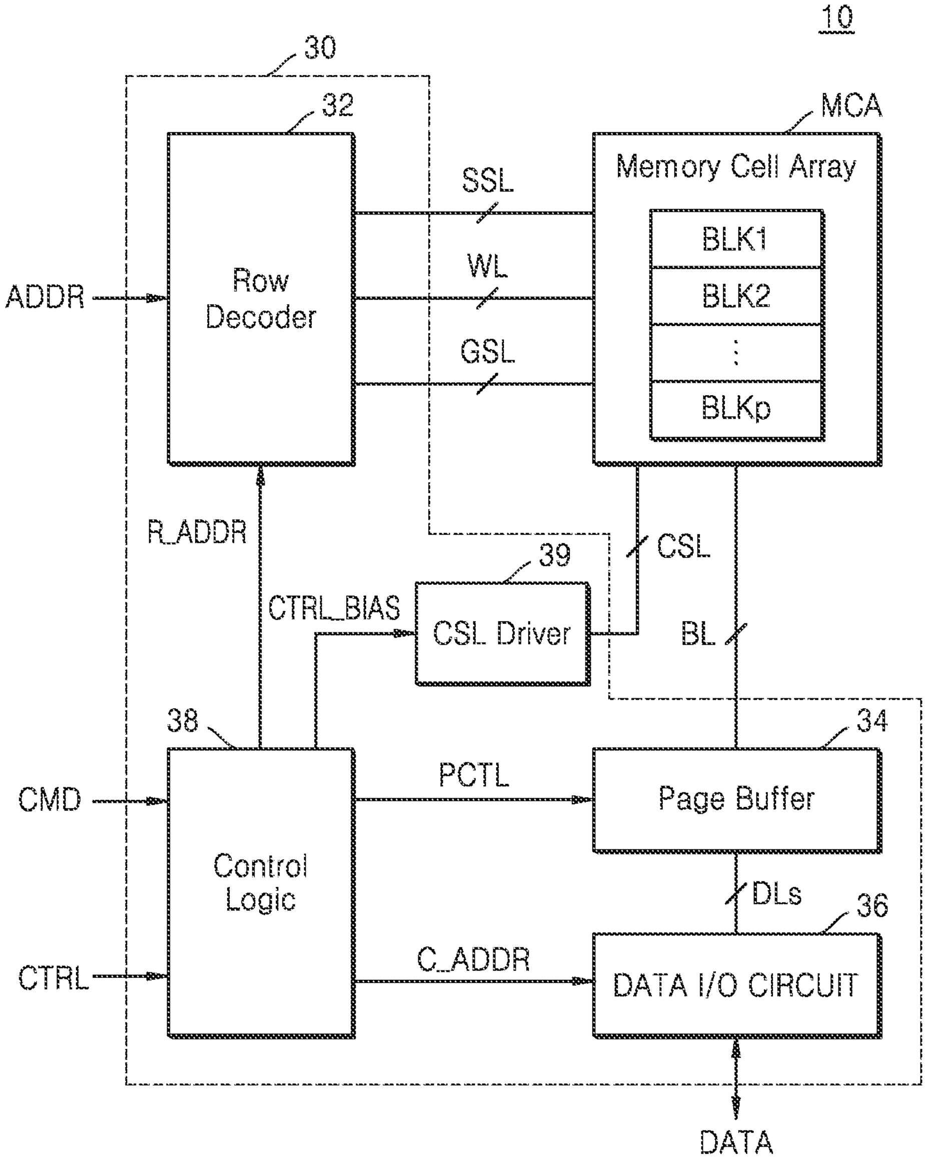
FIG. 1 is a block diagram of an integrated circuit (IC) device according to some embodiments.

FIG. 1 is a block diagram of an integrated circuit (IC) device 10 according to some embodiments.

Referring to FIG. 1, the IC device 10 may include a memory cell array MCA and a peripheral circuit 30. The memory cell array MCA includes a plurality of memory cell blocks BLK1, BLK2, . . . , BLKp. Each of the memory cell blocks BLK1, BLK2, . . . , BLKp may include a plurality of memory cells. The memory cell blocks BLK1, BLK2, . . . , BLKp may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, a control logic 38, and a common source line (CSL) driver 39. The peripheral circuit 30 may further include other circuits, such as a voltage generating circuit generating various voltages for the operation of the IC device 10, an error correction circuit correcting errors in data read from the memory cell array MCA, and an I/O interface.

The memory cell array MCA may be connected to the page buffer 34 through a bit line BL and may be connected to the row decoder 32 through a word line WL, a string select line SSL, and a ground select line GSL. In the memory cell array MCA, each of the memory cells included in the memory cell blocks BLK1, BLK2, . . . , BLKp may be a flash memory cell. The memory cell array MCA may include a 3D memory cell array. The 3D memory cell array may include a plurality of NAND strings, and each NAND string may include a plurality of memory cells respectively connected to a plurality of word lines WL vertically stacked on a substrate.

The peripheral circuit 30 may receive an address ADDR, a command CMD, and a control signal CTRL from the outside of the IC device 10 and may transmit and receive data DATA to and from a device outside the IC device 10.

In response to the address ADDR from the outside, the row decoder 32 may select at least one of the memory cell blocks BLK1, BLK2, . . . , BLKp and may select the word line WL, the string select line SSL, and the ground select line GSL of the selected memory cell block. The row decoder 32 may transmit voltages for performing a memory operation to the word line WL, the string select line SSL, and the ground select line GSL of the selected memory cell block. A plurality of pass transistors may be connected to the word lines WL, the string select line SSL, and the ground select line GSL, and the pass transistors may respectively transfer an operating voltage to the memory cell blocks BLK1, BLK2, . . . , BLKp. In an embodiment, the pass transistors may be high voltage pass transistors respectively transmitting a high voltage to the memory cell blocks BLK1, BLK2, . . . , BLKp. The high voltage may be, for example, about 10V to about 30V.

The page buffer 34 may be connected to the memory cell array MCA through the bit line BL. During a program operation, the page buffer 34 may operate as a write driver to apply a voltage according to the data DATA to be stored in the memory cell array MCA to the bit line BL, and during a read operation, the page buffer 34 may operate as a sense amplifier to sense the data DATA stored in the memory cell array MCA. The page buffer 34 may operate according to a control signal PCTL provided from the control logic 38.

The data I/O circuit 36 may be connected to the page buffer 34 through data lines DLs. During a program operation, the data I/O circuit 36 may receive data DATA from a memory controller (not shown) and provide program data DATA to the page buffer 34 based on a column address C_ADDR provided from the control logic 38. During a read operation, the data I/O circuit 36 may provide the read data DATA stored in the page buffer 34 to the memory controller based on the column address C_ADDR provided from the control logic 38.

The data I/O circuit 36 may transfer an input address or command to the control logic 38 or the row decoder 32. The peripheral circuit 30 may further include an electro static discharge (ESD) circuit and a pull-up/pull-down driver.

The control logic 38 may receive a command CMD and a control signal CTRL from the memory controller. The control logic 38 may provide the row address R_ADDR to the row decoder 32 and the column address C_ADDR to the data I/O circuit 36. The control logic 38 may generate various internal control signals used in the IC device 10 in response to the control signal CTRL. For example, the control logic 38 may adjust voltage levels provided to the word line WL and the bit line BL when a memory operation, such as a program operation or an erase operation, is performed.

The CSL driver 39 may be connected to the memory cell array MCA through the common source line CSL. The CSL driver 39 may apply a common source voltage (e.g., power supply voltage) or a ground voltage to the common source line CSL based on a control signal CTRL_BIAS from the control logic 38.

Figure 2:
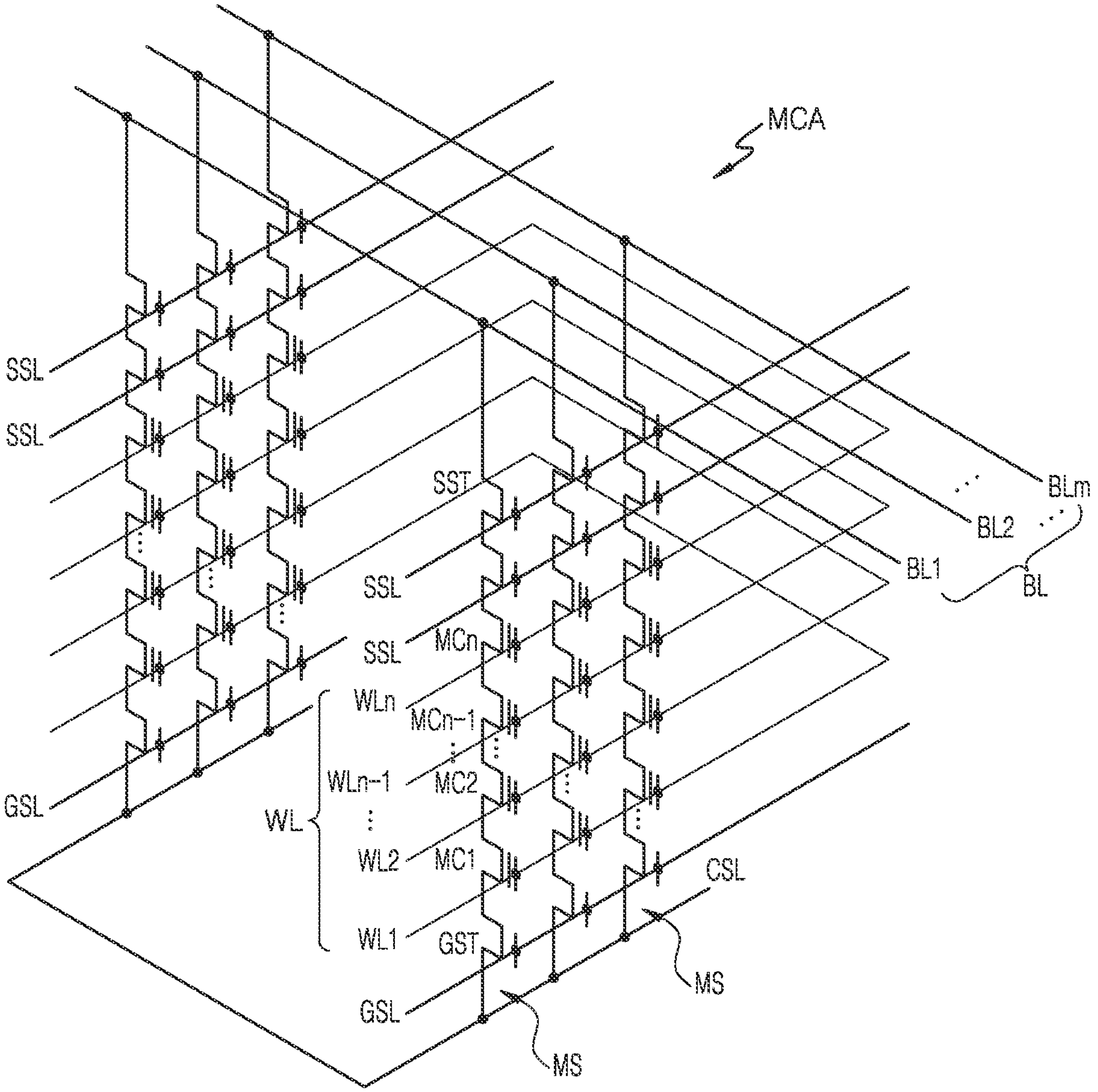
FIG. 2 is an equivalent circuit diagram of a memory cell array of an IC device according to some embodiments.

FIG. 2 is an equivalent circuit diagram of a memory cell array MCA of an IC device according to some embodiments.

Referring to FIG. 2, the memory cell array MCA may include a plurality of memory cell strings MS. The memory cell array MCA may include a plurality of bit lines BL (BL1, BL2, . . . , BLm), a plurality of word lines WL (WL1, WL2, . . . , WLn−1, WLn), at least one string select line SSL, at least one ground select line GSL, and a common source line CSL. The memory cell strings MS may be formed between the bit lines BL (BL1, BL2, . . . , BLm) and the common source line CSL. Although FIG. 2 illustrates a case in which each of the memory cell strings MS includes two string select lines SSL, embodiments not limited thereto. For example, each of the memory cell strings MS may include two string select lines SSL.

Each of the memory cell strings MS may include a string select transistor SST, a ground select transistor GST, and a plurality of memory cell transistors MC1, MC2, . . . , MCn−1, MCn. A drain region of the string select transistor SST may be connected to the bit lines BL (BL1, BL2, . . . , BLm), and a source region of the ground select transistor GST may be connected to the common source line CSL. The common source line CSL may be a region to which source regions of a plurality of ground select transistors GST are connected in common.

The string select transistor SST may be connected to the string select line SSL, and the ground select transistor GST may be connected to the ground select line GSL. The memory cell transistors MC1, MC2, . . . , MCn−1, MCn may be connected to the word lines WL (WL1, WL2, . . . , WLn−1, WLn), respectively. The pass transistors may be connected to the word lines WL (WL1, WL2, . . . , WLn−1, WLn), the string select line SSL, and the ground select line GSL, and the pass transistors may be configured to transfer an operating voltage to the word lines WL (WL1, WL2, . . . , WLn−1, WLn), the string select line SSL, and the ground select line GSL. In an embodiment, the pass transistors may be high voltage pass transistors transferring a high voltage to the word lines WL (WL1, WL2, . . . , WLn−1, WLn), the string select line SSL, and the ground select line GSL.

Figure 3:
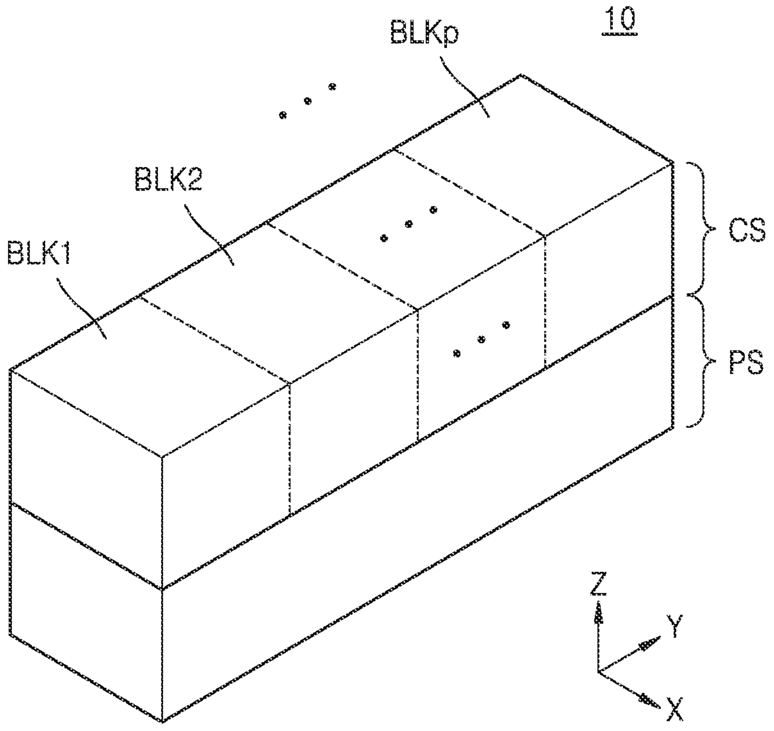
FIG. 3 is a schematic perspective view of an IC device according to some embodiments.

FIG. 3 is a schematic perspective view of the IC device 10 according to some embodiments.

Referring to FIG. 3, the IC device 10 includes a memory cell array structure CS and a peripheral circuit structure PS overlapping each other in the vertical direction (Z direction). The memory cell array structure CS may include the memory cell array MCA described above with reference to FIG. 1. The peripheral circuit structure PS may include the peripheral circuit 30 described above with reference to FIG. 1.

The memory cell array structure CS may include a plurality of tiles. Each of the tiles may include a plurality of memory cell blocks BLK1, BLK2, . . . , BLKp. Each of the memory cell blocks BLK1, BLK2, . . . , BLKp may include three-dimensionally arranged memory cells.

In an embodiment, two tiles may constitute one mat but are not limited thereto. For example, the memory cell array MCA described above with reference to FIG. 1 may include a plurality of mats.

Figure 4:
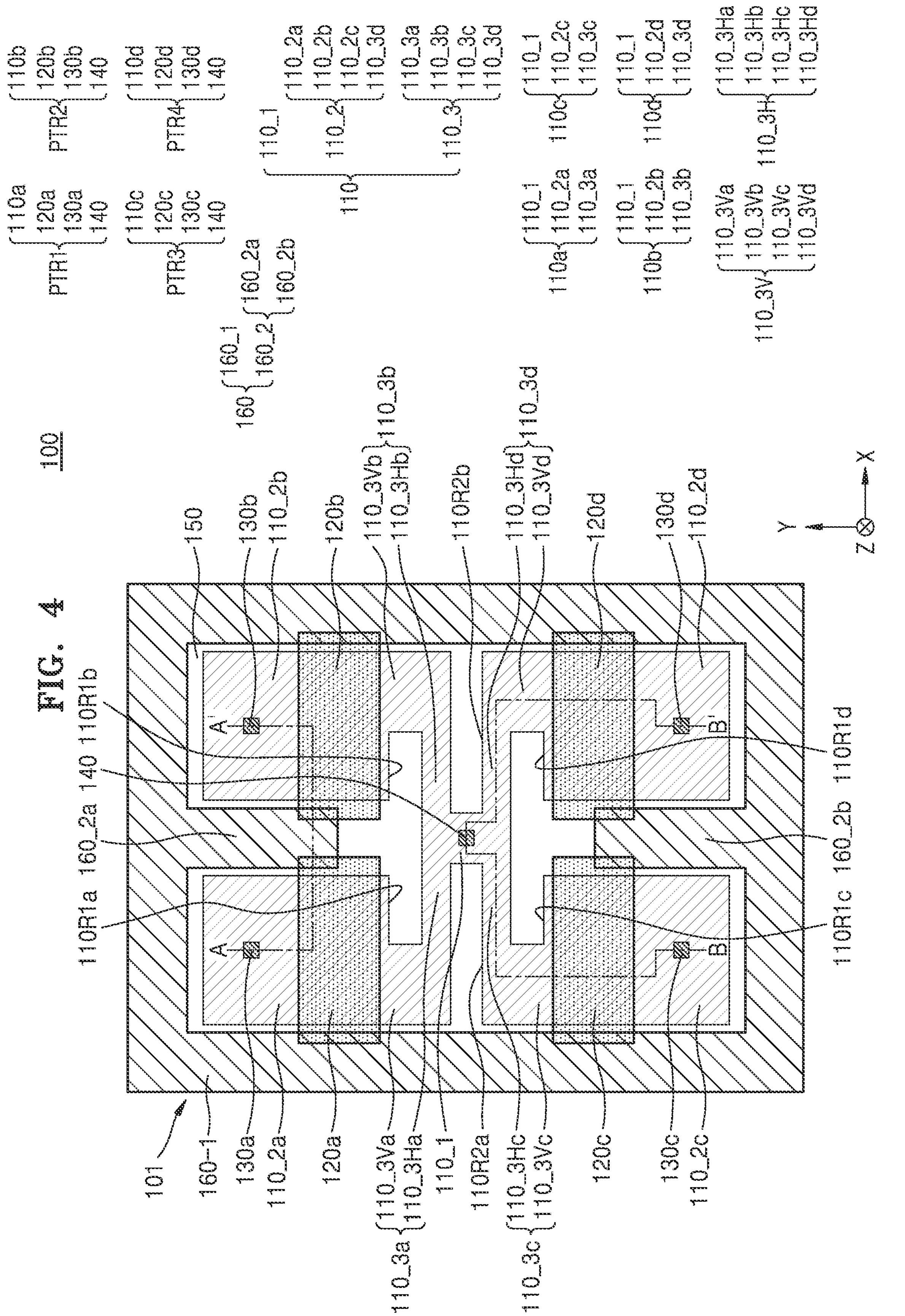
FIG. 4 is a layout diagram illustrating a pass transistor included in an IC device according to some embodiments.
Figure 5A:
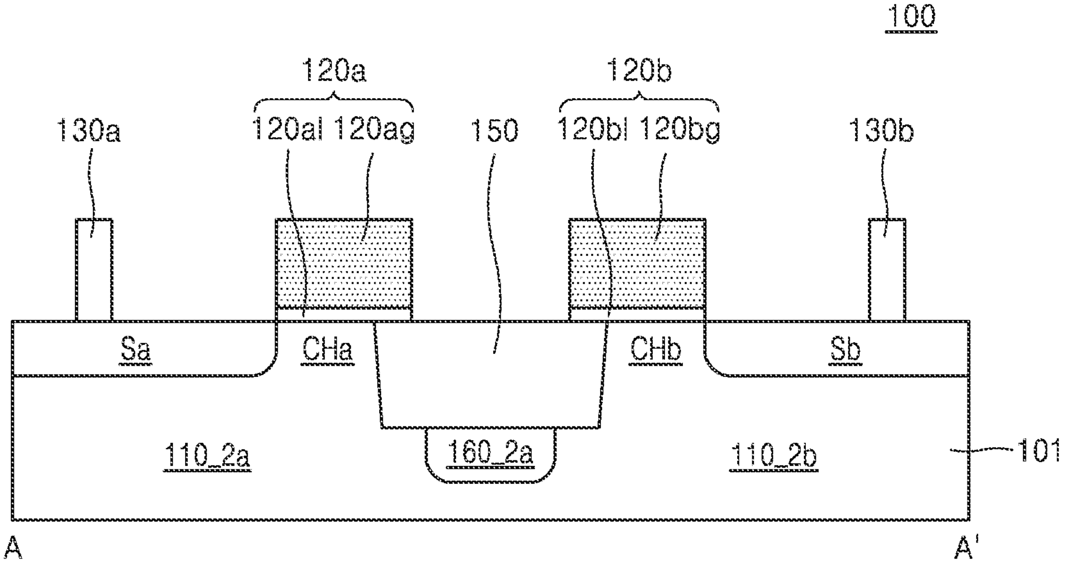
FIGS. 5A and 5B are cross-sectional views illustrating pass transistors included in IC devices according to some embodiments.
Figure 5B:
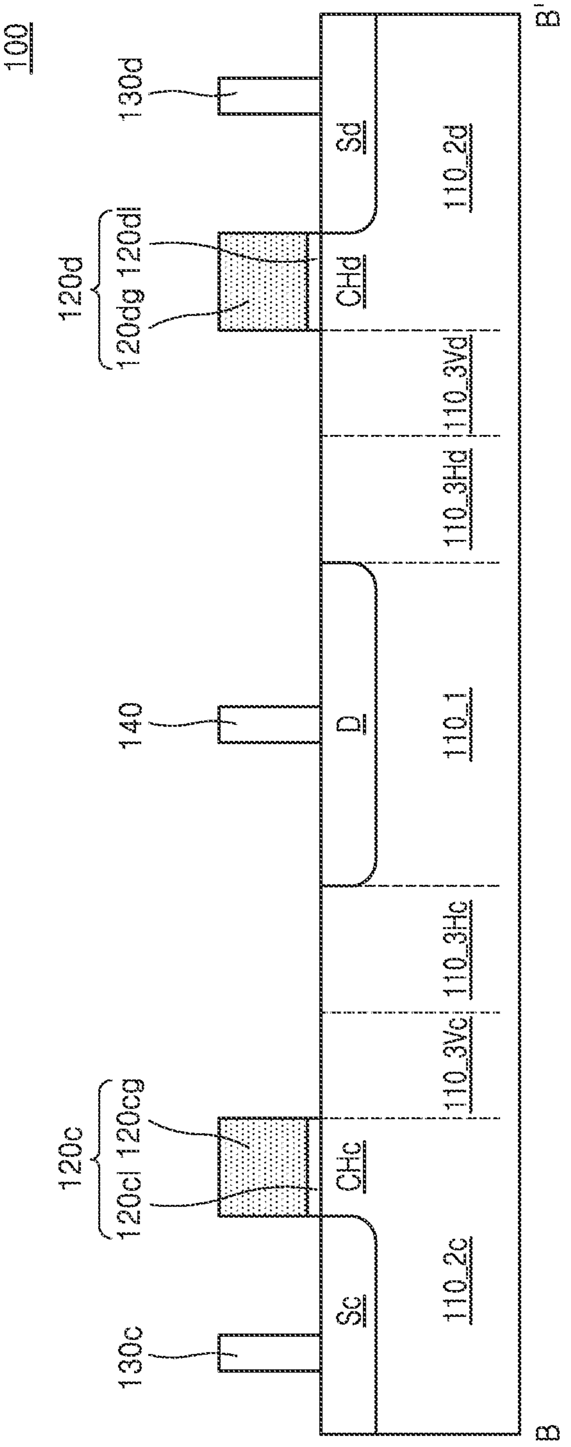

FIG. 4 is a layout diagram illustrating a pass transistor included in an IC device 100 according to some embodiments. FIGS. 5A and 5B are cross-sectional views illustrating pass transistors included the IC device 100 according to some embodiments. In detail, FIGS. 5A and 5B are cross-sectional views taken along lines A-A' and B-B' of FIG. 4.

Referring to FIGS. 4, 5A, and 5B together, the IC device 100 may include a substrate 101 and a first gate structure 120*a*, a second gate structure 120*b*, a third gate structure 120*c*, and a fourth gate structure 120*d*. The IC device 100 may be disposed in the peripheral circuit structure PS described above with reference to FIG. 3.

The substrate 101 may include a semiconductor substrate. For example, the substrate 101 may include a semiconductor material, for example, a group IV semiconductor, a group III-V compound semiconductor, or a group II-VI oxide semiconductor. For example, the group IV semiconductor may include silicon (Si), germanium (Ge), or silicon-germanium (SiGe). The substrate 101 may be provided as a bulk wafer or an epitaxial layer. In another embodiment, the substrate 101 may include a silicon-on-insulator (SOI) substrate or a germanium-on-insulator (GeOI) substrate.

An active region 110 may be defined in the substrate 101 by a device isolation film 150.

Each of the first, second, third, and fourth gate structures 120*a*, 120*b*, 120*c*, and 120*d* may cross the active region 110 in the substrate 101 and extend in a first horizontal direction (X direction). The active region 110 and the first, second, third, and fourth gate structures 120*a*, 120*b*, 120*c*, and 120*d* crossing the active region 110 may configure a first pass transistor PTR1, a second pass transistor PTR2, a third pass transistor PTR3, and a fourth pass transistor PTR4.

The active region 110 may include a central active region 110_1, a base active region 110_2, and an extended active region 110_3. The central active region 110_1, the base active region 1102, and the extended active region 110_3 included in the active region 110 may form an integral body. In an embodiment, the active region 110 including the central active region 110_1, the base active region 1102, and the extended active region 1103 together may have a windmill shape on the X-Y plane as illustrated by the shaded portion in FIG. 4. The active region 110 may be a region doped with a first impurity. The first impurity may be, for example, a p-type impurity, such as boron (B), indium (In), gallium (Ga), or aluminum (Al) but is not limited thereto. For example, the first impurity may be an n-type impurity, such as phosphorus (P), arsenic (As), bismuth (Bi), or antimony (Sb).

The central active region 110_1 may extend in a second horizontal direction (Y direction) perpendicular to the first horizontal direction (the X direction). The central active region 110_1 may have a rectangular shape on the X-Y plane. A drain region D may be located above the central active region 110_1. The drain region D may be a region doped with a second impurity, different from the first impurity. The second impurity may be, for example, an n-type impurity, such as phosphorus (P), arsenic (As), bismuth (Bi), or antimony (Sb) but is not limited thereto. For example, the second impurity may be a p-type impurity, such as boron (B), indium (In), gallium (Ga), or aluminum (Al). A drain contact 140 may be connected on the drain region D. The drain contact 140 may receive an operating voltage from a voltage generating circuit included in the peripheral circuit 30 (refer to FIG. 1), and transfer the operating voltage to the word line WL (refer to FIG. 1), the string select line SSL (refer to FIG. 1), and the ground select line GSL (refer to FIG. 1) of a selected memory cell block. The operating voltage may be, for example, a program voltage Vpgm. In an embodiment, the drain contact 140 may be located in an oblique direction with respect to the first, second, third, and fourth gate structures 120*a*, 120*b*, 120*c*, and 120*d* on the X-Y plane. In an embodiment, separation distances between the drain contact 140 and each of the first, second, third, and fourth gate structures 120*a*, 120*b*, 120*c*, and 120*d* may be equal to each other. For example, in some embodiments, the separation distance may be a shortest distance from the drain contact 140 to each of the first, second, third, and fourth gate structures 120*a*, 120*b*, 120*c*, and 120*d*. In some embodiments, the separation distance may be a distance from a center of the drain contact 140 to a center of each of the first, second, third, and fourth gate structures 120*a*, 120*b*, 120*c*, and 120*d*. Because the drain contact 140 is located in the oblique direction with respect to the first, second, third, and fourth gate structures 120*a*, 120*b*, 120*c*, and 120*d*, the area occupied by the first, second, third, and fourth pass transistors PTR1, PTR2, PTR3, and PTR4 may be reduced, while the separation distances between drain contact 140 and each of the first, second, third, and fourth gate structures 120*a*, 120*b*, 120*c*, and 120*d* are maintained. Therefore, breakdown of gate dielectric films 120*al*, 120*bl*, 120*cl*, and 120*dl* due to a field that may occur when the separation distances between the drain contact 140 and each of the first, second, third, and fourth gate structures 120*a*, 120*b*, 120*c*, and 120*d* are reduced may be prevented, while the area occupied by the first, second, third, and fourth pass transistors PTR1, PTR2, PTR3, and PTR4 may be reduced.

The base active region 110_2 may include a first base active region 110_2*a*, a second base active region 110_2*b*, a third base active region 110_2*c*, and a fourth base active region 110_2*d*. The first, second, third, and fourth base active regions 110_2*a*, 110_2*b*, 110_2*c*, and 110_2*d* may extend in the second horizontal direction (the Y direction). The first, second, third, and fourth base active regions 110_2*a*, 110_2*b*, 110_2*c*, and 110_2*d* may have a rectangular shape on an X-Y plane. In an embodiment, the drain contact 140 may be located in an oblique direction with respect to the first, second, third, and fourth base active regions 110_2*a*, 110_2*b*, 110_2*c*, and 110_2*d* on the X-Y plane. For example, the first, second, third, and fourth base active regions 110_2*a*, 110_2*b*, 110_2*c*, and 110_2*d* may be located in different diagonal directions of the central active region 110_1 in which the drain contact 140 is disposed on the X-Y plane and may be spaced apart from each other. In an embodiment, the separation distances between the drain contact 140 and each of the first, second, third, and fourth base active regions 110_2*a*, 110_2*b*, 110_2*c*, and 110_2*d* may be equal to each other. For example, in some embodiments, the separation distance may be a shortest distance from the drain contact 140 to each of the first, second, third, and fourth base active regions 110_2*a*, 110_2*b*, 110_2*c*, and 110_2*d*. In some embodiments, the separation distance may be a distance from a center of the drain contact 140 to a center of each of the first, second, third, and fourth base active regions 110_2*a*, 110_2*b*, 110_2*c*, and 110_2*d*.

In an embodiment, the first base active region 110_2*a* may be linearly symmetrical to the second base active region 110_2*b* based on an imaginary first straight line passing through the center of the central active region 110_1 and extending in the second horizontal direction (the Y direction), and the third base active region 110_2*c* may be linearly symmetrical to the fourth base active region 110_2*d* based on the imaginary first straight line. In an embodiment, the first base active region 110_2*a* may be linearly symmetrical to the third base active region 110_2*c* based on an imaginary second straight line passing through the center of the central active region 110_1 and extending in the first horizontal direction (the X direction), and the second base active region 110_2*b* may be linearly symmetrical to the fourth base active region 110_2*d* based on the imaginary second straight line.

A first source regions Sa, a second source region Sb, a third source region Sc, and a fourth source region Sd may be located above the first, second, third, and fourth base active regions 110_2*a*, 110_2*b*, 110_2*c*, and 110_2*d*, respectively. In detail, the first source region Sa may be located above the first base active region 110_2*a*, the second source region Sb may be located above the second base active region 110_2*b*, the third source region Sc may be located above the third base active region 110_2*c*, and the fourth source region Sd may be located above the fourth base active region 110_2*d*. The first, second, third, and fourth source regions Sa, Sb, Sc, and Sd may be regions doped with the second impurity.

The extended active region 1103 may include a connection extended active region 110_3V and a refraction extended active region 110_3H. The connection extended active region 110_3V may include a first connection extended active region 110_3Va, a second connection extended active region 110_3Vb, a third connection extended active region 110_3Vc, and a fourth connection extended active region 110_3Vd, and the refraction extended active region 110_3H may include a first refraction extended active region 110_3Ha, a second refraction extended active region 110_3Hb, a third refraction extended active region 110_3Hc, and a fourth refraction extended active region 110_3Hd. The extended active region 110_3 may include a first extended active region 110_3*a*, a second extended active region 110_3*b*, a third extended active region 110_3*c*, and a fourth extended active region 110_3*d*. The first extended active region 110_3*a* may include a first connection extended active region 110_3Va and a first refraction extended active region 110_3Ha, the second extended active region 110_3*b* may include a second connection extended active region 110_3Vb and a second refraction extended active region 110_3Hb, the third extended active region 110_3*c* may include a third connection extended active region 110_3Vc and a third refraction extended active region 110_3Hc, and the fourth extended active region 110_3*d* may include a fourth connection extended active region 110_3Vd and a fourth refraction extended active region 110_3Hd. In an embodiment, each of the first, second, third, and fourth extended active regions 110_3*a*, 110_3*b*, 110_3*c*, and 110_3*d* may have an L-shape, and ends of the first, second, third, and fourth extended active regions 110_3*a*, 110_3*b*, 110_3*c*, and 110_3*d* may be connected to the first, second, third, and fourth base active regions 110_2*a*, 110_2*b*, 110_2*c*, and 110_2*d*, respectively, and the other ends of the first, second, third, and fourth extended active regions 110_3*a*, 110_3*b*, 110_3*c*, and 110_3*d* may all be connected to the central active region 110_1.

The first, second, third, and fourth connection extended active regions 110_3Va, 110_3Vb, 110_3Vc, and 110_3Vd may be connected to the first, second, third, and fourth base active regions 110_2*a*, 110_2*b*, 110_2*c*, and 110_2*d*, respectively, and may extend in the second horizontal direction (the Y direction). The first, second, third, and fourth refraction extended active regions 110_3Ha, 110_3Hb, 110_3Hc, and 110_3Hd may be respectively refracted from the first, second, third, and fourth connection extended active regions 110_3Va, 110_3Vb, 110_3Vc, and 110_3Vd and extend in the first horizontal direction (the X direction) to be connected to the central active region 110_1. The first, second, third, and fourth refraction extended active regions 110_3Ha, 110_3Hb, 110_3Hc, and 110_3Hd may be respectively between the first, second, third, and fourth connection extended active regions 110_3Va, 110_3Vb, 110_3Vc, and 110_3Vd and the central active region 110_1.

The first, second, third, and fourth source regions Sa, Sb, Sc, and Sd may be respectively located above the first, second, third, and fourth base active regions 110_2*a*, 110_2*b*, 110_2*c*, and 110_2*d*. In detail, the first source region Sa may be located above the first base active region 110_2*a*, the second source region Sb may be located above the second base active region 110_2*b*, the third source region Sc may be located above the third base active region 110_2*c*, and the fourth source region Sd may be located above the fourth base active region 110_2*d*. The first, second, third, and fourth source regions Sa, Sb, Sc, and Sd may be regions doped with the second impurity. The second impurity may be, for example, an n-type impurity, such as phosphorus (P).

A first source contact 130*a*, a second source contact 130*b*, a third source contact 130*c*, and a fourth source contact 130*d* may be connected to the first, second, third, and fourth source regions Sa, Sb, Sc, and Sd, respectively. The first, second, third, and fourth source contacts 130*a*, 130*b*, 130*c*, and 130*d* may receive the operating voltage from the drain contact 140 and transfer the operating voltage to the word line WL (refer to FIG. 1), the string select line SSL (refer to FIG. 1), and the ground select line GSL (refer to FIG. 1) of a selected memory cell block. For example, when a memory cell block (hereinafter, referred to as a first memory cell block) connected to the first source contact 130*a* is selected, the first source contact 130*a* may receive the operating voltage from the drain contact 140 and transfer the operating voltage to the word line of the first memory cell block.

The central active region 110_1, the first base active region 110_2*a*, and the first extended active region 110_3*a* may be collectively referred to as the first active region 110*a*. The central active region 110_1, the second base active region 110_2*b*, and the second extended active region 110_3*b* may be collectively referred to as the second active region 110*b*. The central active region 110_1, the third base active region 110_2*c*, and the third extended active region 110_3*c* may be collectively referred to as the third active region 110*c*. The central active region 110_1, the fourth base active region 110_2*d*, and the fourth extended active region 110_3*d* may be collectively referred to as a fourth active region 110*d*. In other words, the central active region 110_1 may be shared by the first, second, third, and fourth active regions 110*a*, 110*b*, 110*c*, and 110*d*.

In an embodiment, the first active region 110*a* may be linearly symmetrical to the second active region 110*b* based on a first imaginary straight line passing through the center of the central active region 110_1 and extending in the second horizontal direction (the Y direction), and the third active region 110*c* may be linearly symmetrical to the fourth active region 110*d* based on the imaginary first straight line. In an embodiment, the first active region 110*a* may be linearly symmetrical to the third active region 110*c* based on a second imaginary straight line passing through the center of the central active region 110_1 and extending in the first horizontal direction (the X direction), and the second active region 110*b* may be linearly symmetrical to the fourth active region 110*d* based on the imaginary second straight line.

In the first horizontal direction (the X direction), a horizontal width of the connection extended active region 110_3V may be less than a horizontal width of the base active region 110_2. In an embodiment, in the first horizontal direction (the X direction), a horizontal width of the connection extended active region 110_3V may be less than half of the horizontal width of the base active region 110_2. For example, in the first horizontal direction (the X direction), a horizontal width of the base active region 1102 may be about 1 μm or more and the horizontal width of the connection extended active region 110_3V may be about 0.5 μm or less. In an embodiment, in the first horizontal direction (the X direction), the horizontal width of the base active region 110_2 may be about 1 μm to about 3 μm and the horizontal width of the connection extended active region 1103V may be about 0.1 μm to about 0.5 μm. In the first horizontal direction (the X direction), a horizontal width of the first connection extended active region 110_3Va may be less than a horizontal width of the first base active region 110_2*a*, a horizontal width of the second connection extended active region 110_3Vb may be less than a horizontal width of the second base active region 110_2*b*, a horizontal width of the third connection extended active region 110_3Vc may be less than a horizontal width of the third base active region 110_2*c*, and a horizontal width of the fourth connection extended active region 110_3Vd may be less than a horizontal width of the fourth base active region 110_2*d*.

A horizontal width of the refraction extended active region 110_3H in the second horizontal direction (the Y direction) may be less than a horizontal width of the base active region 110_2 in the first horizontal direction (the X direction). For example, a horizontal width of the first refraction extended active region 110_3Ha in the second horizontal direction (the Y direction) may be less than a horizontal width of the first base active region 110_2*a* in the first horizontal direction (the X direction), a horizontal width of the second refraction extended active region 110_3Hb in the second horizontal direction (the Y direction) may be less than a horizontal width of the second base active region 110_2*b* in the first horizontal direction (the X direction), a horizontal width of the third refraction extended active region 110_3Hc in the second horizontal direction (the Y direction) may be less than a horizontal width of the third base active region 110_2*c* in the first horizontal direction (the X direction), and a horizontal width of the fourth refraction extended active region 110_3Hd in the second horizontal direction (the Y direction) may be less than a horizontal width of the fourth base active region 110_2*d* in the first horizontal direction (the X direction).

A horizontal width of the refraction extended active region 110_3H in the second horizontal direction (the Y direction) may be equal to or less than a horizontal width of the connection extended active region 110_3V in the first horizontal direction (the X direction). In FIG. 4, the horizontal width of the refraction extended active region 110_3H in the second horizontal direction (the Y direction) is less than the horizontal width of the connection extended active region 110_3V in the first horizontal direction (the X direction), but this is an example and embodiments are not limited thereto. The horizontal width of the refraction extended active region 110_3H in the second horizontal direction (the Y direction) may be substantially equal to the horizontal width of the connection extended active region 110_3V in the first horizontal direction (the X direction). For example, the horizontal width of the first refraction extended active region 110_3Ha in the second horizontal direction (the Y direction) may be equal to or less than the horizontal width of the first connection active region 110_3Va in the first horizontal direction (the X direction). The horizontal width of the second refraction extended active region 110_3Hb in the second horizontal direction (the Y direction) may be equal to or less than the horizontal width of the second connection active region 110_3Vb in the first horizontal direction (the X direction). The horizontal width of the third refraction extended active region 110_3Hc in the second horizontal direction (the Y direction) may be equal to or less than the horizontal width of the third connection active region 110_3Vc in the first horizontal direction (the X direction). The horizontal width of the fourth refraction extended active region 110_3Hd in the second horizontal direction (the Y direction) may be equal to or less than the horizontal width of the fourth connection active region 110_3Vd in the first horizontal direction (the X direction).

One end of the connection extended active region 110_3V in the first horizontal direction (the X direction) may be aligned with one end of the base active region 110_2 in the second horizontal direction (the Y direction), the other end of the connection extended active region 110_3V in the first horizontal direction (the X direction) may not be aligned with the other end of the base active region 1102, and the other end of the connection extended active region 110_3V in the first horizontal direction (the X direction) may be shifted from the other end of the base active region 1102 to the inside of the base active region 110_2 in the first horizontal direction (the X direction). The other end of the first connection extended active region 110_3Va may face the other end of the second connection extended active region 110_3Vb, and one end of the first connection extended active region 110_3Va may be opposite to the second connection extended active region 110_3Vb. The other end of the third connection extended active region 110_3Vc may face the other end of the fourth connection extended active region 110_3Vd, and one end of the third connection extended active region 110_3Vc may be opposite to the fourth connection extended active region 110_3Vd.

A first reduction hole 110R1*a* may be defined among the first base active region 110_2*a*, the first connection extended active region 110_3Va, and the first refraction extended active region 110_3Ha. A second reduction hole 110R1*b* may be defined among the second base active region 110_2*b*, the second connection extended active region 110_3Vb, and the second refraction extended active region 110_3Hb. A third reduction hole 110R1*c* may be defined among the third base active region 110_2*c*, the third connection extended active region 110_3Vc, and the third refraction extended active region 110_3Hc. A fourth reduction hole 110R1*d* may be defined among the fourth base active region 110_2*d*, the fourth connection extended active region 110_3Vd, and the fourth refraction extended active region 110_3Hd.

The first reduction hole 110R1*a* may extend from the other end of the first base active region 110_2*a* toward the other end of the first connection extended active region 110_3Va in the first horizontal direction (the X direction). The second reduction hole 110R1*b* may extend from the other end of the second base active region 110_2*b* toward the other end of the second connection extended active region 110_3Vb in the first horizontal direction (the X direction). The third reduction hole 110R1*c* may extend from the other end of the third base active region 110_2*c* toward the other end of the third connection extended active region 110_3Vc in the first horizontal direction (the X direction). The fourth reduction hole 110R1*d* may extend from the other end of the fourth base active region 110_2*d* toward the other end of the fourth connection extended active region 110_3Vd in the first horizontal direction (the X direction).

The first refraction extended active region 110_3Ha may be spaced apart from the third refraction extended active region 110_3Hc with a first shared hole 110R2*a* therebetween, and the second refraction extended active region 110_3Hb may be spaced apart from the fourth refraction extended active region 110_3Hd with a second shared hole 110R2*b* therebetween. The first shared hole 110R2*a* may be defined by the first refraction extended active region 110_3Ha, the third refraction extended active region 110_3Hc, and the central active region 110_1. The second shared hole 110R2*b* may be defined by the second refraction extended active region 110_3Hb, the fourth refraction extended active region 110_3Hd, and the central active region 110_1. The first shared hole 110R2*a* may extend from one end of the first refraction extended active region 110_3Ha and one end of the third refraction extended active region 110_3Hc toward the central active region 110_1 in the first horizontal direction (the X direction). The second shared hole 110R2*b* may extend from one end of the second refraction extended active region 110_3Hb and one end of the fourth refraction extended active region 110_3Hd toward the central active region 110_1 in the first horizontal direction (the X direction).

The first, second, third, and fourth extended active regions 110_3*a*, 110_3*b*, 110_3*c*, and 110_3*d* may be defined by the first, second, third, and fourth reduction holes 110R1*a*, 110R1*b*, 110R1*c*, and 110R1*d*, and the first and second shared holes 110R2*a* and 110R2*b* to have an L-shape.

The first, second, third, and fourth gate structures 120*a*, 120*b*, 120*c*, and 120*d* may be located to be spaced apart from each other on the substrate 101. In detail, the first gate structure 120*a* may be disposed on the first active region 110*a* of the substrate 101, the second gate structure 120*b* may be disposed on the second active region 110*b* of the substrate 101, the third gate structure 120*c* may be disposed on the third active region 110*c* of the substrate 101, and the fourth gate structure 120*d* may be disposed on the fourth active region 110*d* of the substrate 101 to be spaced apart from each other. In an embodiment, the first, second, third, and fourth gate structures 120*a*, 120*b*, 120*c*, and 120*d* may be respectively disposed on first, second, third, and fourth base active regions 110_2*a*, 110_2*b*, 110_2*c*, and 110_2*d* to be spaced apart from each other. For example, each of the first, second, third, and fourth gate structures 120*a*, 120*b*, 120*c*, and 120*d* may be arranged not to overlap the central active region 110_1 and the extended active region 110_3 in the vertical direction (Z direction). For example, the first, second, third, and fourth gate structures 120*a*, 120*b*, 120*c*, and 120*d* may not overlap the first, second, third, and fourth reduction holes 110R1*a*, 110R1*b*, 110R1*c*, and 110R1*d*, respectively, in the vertical direction (the Z direction).

A first channel region CHa, a second channel region CHb, a third channel region CHc, and a fourth channel region CHd may be located above the first, second, third, and fourth base active regions 110_2*a*, 110_2*b*, 110_2*c*, and 110_2*d* respectively overlapping the first, second, third, and fourth gate structures 120*a*, 120*b*, 120*c*, and 120*d* in the vertical direction (the Z direction). For example, the first channel region CHa may be located above the first base active region 110_2*a* overlapping the first gate structure 120*a* in the vertical direction (Z direction), the second channel region CHb may be located above the second base active region 110_2*b* overlapping the second gate structure 120*b* in the vertical direction (the Z direction), the third channel region CHc may be located above the third base active region 110_2*c* overlapping the third gate structure 120*c* in the vertical direction (the Z direction), and the fourth channel region CHd may be located above the fourth base active region 110_2*d* overlapping the fourth gate structure 120*d* in the vertical direction (the Z direction).

The first active region 110*a*, the first gate structure 120*a*, the first source contact 130*a*, and the drain contact 140 may configure the first pass transistor PTR1. The second active region 110*b*, the second gate structure 120*b*, the second source contact 130*b*, and the drain contact 140 may configure the second pass transistor PTR2. The third active region 110*c*, the third gate structure 120*c*, the third source contact 130*c*, and the drain contact 140 may configure the third pass transistor PTR3. The fourth active region 110*d*, the fourth gate structure 120*d*, the fourth source contact 130*d*, and the drain contact 140 may configure the fourth pass transistor PTR4. In some embodiments, the first gate structure 120*a* may configure the first pass transistor PTR1 together with the first source region Sa and the drain region D, the second gate structure 120*b* may configure the second pass transistor PTR2 together with the second source region Sb and the drain region D, the third gate structure 120*c* may configure the third pass transistor PTR3 together with the third source region Sc and the drain region D, and the fourth gate structure 120*d* may configure the fourth pass transistor PTR4 together with the fourth source region Sd and the drain region D. The first, second, third, and fourth pass transistors PTR1, PTR2, PTR3, and PTR4 may share one drain region D.

Each of the first, second, third, and fourth pass transistors PTR1, PTR2, PTR3, and PTR4 may transmit an operating voltage to different memory cell blocks. For example, one of the first, second, third, and fourth pass transistors PTR1, PTR2, PTR3, and PTR4 may be configured to transfer an operating voltage to any one of different memory cell blocks based on a memory cell block selection signal.

In an embodiment, the first, second, third, and fourth pass transistors PTR1, PTR2, PTR3, and PTR4 may be high voltage pass transistors capable of transferring a high voltage to the memory cell block. The high voltage may be, for example, about 10V to about 30V.

The first, second, third, and fourth gate structures 120*a*, 120*b*, 120*c*, and 120*d* may include a first gate dielectric film 120*al*, a second gate dielectric film 120*bl*, a third gate dielectric film 120*cl*, and a fourth gate dielectric film 120*dl* and a first gate electrode 120*ag*, a second gate electrode 120*bg*, a third gate electrode 120*cg*, and a fourth gate electrode 120*dg* disposed on the first, second, third, and fourth gate dielectric films 120*al*, 120*bl*, 120*cl*, and 120*dl*, respectively. Each of the first, second, third, and fourth gate dielectric films 120*al*, 120*bl*, 120*cl*, and 120*dl* may include, for example, silicon oxide, silicon nitride, silicon oxynitride, a high-k material, or combinations thereof. The high-k material may include metal oxide or metal oxynitride. The high-k material may include a material having a dielectric constant higher than that of silicon oxide. For example, the high-k material may have a dielectric constant of about 10 to about 25. Each of the first, second, third, and fourth gate electrodes 120*ag*, 120*bg*, 120*cg*, and 120*dg* may include, for example, aluminum, silver, copper, molybdenum, chromium, tantalum, tungsten, titanium, or combinations thereof.

In the substrate 101, an isolation region 160 may be located below the device isolation film 150. The isolation region 160 may be a region doped with the first impurity. The isolation region 160 may electrically isolate the first, second, third, and fourth source regions Sa, Sb, Sc, and Sd from each other. The isolation region 160 may be located to surround the first, second, third, and fourth source regions Sa, Sb, Sc, and Sd in a plan view.

The isolation region 160 may include a base isolation region 160_1 surrounding the active region 110 and an extended isolation region 160_2 extending in the second horizontal direction (the Y direction) from the base isolation region 160_1 toward the central active region 110_1. The extended isolation region 160_2 may include a first extended isolation region 160_2*a* and a second extended isolation region 160_2*b* respectively extending from opposite portions of the base isolation region 160_1. The first extended isolation region 160_2*a* may extend from the base isolation region 160_1 in the second horizontal direction (the Y direction) between the first base active region 110_2*a* and the third base active region 1102*c*. The second extended isolation region 160_2*b* may extend from the base isolation region 160_1 in the second horizontal direction (the Y direction) between the second base active region 110_2*b* and the fourth base active region 110_2*d*.

In an embodiment, the first extended isolation region 160_2*a* may extend in the second horizontal direction (the Y direction) to pass between the first source contact 130*a* and the second source contact 130*b*, and the second extended isolation region 160_2*b* may extend in the second horizontal direction (the Y direction) to pass between the third source contact 130*c* and the fourth source contact 130*d*. Through this configuration, the first extended isolation region 160_2*a* may electrically isolate the first source contact 130*a* from the second source contact 130*b*, and the second extended isolation region 160_2*b* may electrically isolate the third source contact 130*c* from the fourth source contact 130*d*. In FIG. 4, the first extended isolation region 160_2*a* extends in the second horizontal direction (the Y direction) to come between the first gate structure 120*a* and the second gate structure 120*b*, and the second extended isolation region 160_2*b* extends in the second horizontal direction (the Y direction) to come between the third gate structure 120*c* and the fourth gate structure 120*d*, but in some embodiments, the first extended isolation region 160_2*a* and the second extended isolation region 160_2*b* may extend more or less than to come between the gate structures.

The IC device 100 according to various embodiments includes the active region 110 having a windmill shape and the first, second, third, and fourth gate structures 120*a*, 120*b*, 120*c* and 120*d* disposed on the active region 110. The active region 110 and the first, second, third, and fourth gate structures 120*a*, 120*b*, 120*c*, and 120*d* may configure the first, second, third, and fourth pass transistors PTR1, PTR2, PTR3, and PTR4, respectively, and share one drain region of the active region 110. Accordingly, in the IC device 100 according to various embodiments, an area occupied by the first, second, third, and fourth pass transistors PTR1, PTR2, PTR3, and PTR4 may decrease.

In the IC device 100 according to various embodiments, because the first, second, third, and fourth active regions 110*a*, 110*b*, 110*c*, and 110*d* are defined by the first, second, third, and fourth reduction holes 110R1*a*, 110R1*b*, 110R1*c*, and 110R1*d* and the first and second shared holes 110R2*a* and 110R2*b* to include first, second, third, and fourth extended active regions 110_3*a*, 110_3*b*, 110_3*c*, and 110_3*d* each having an L-shape, extension lengths of the first, second, third, and fourth active regions 110*a*, 110*b*, 110*c*, and 110*d*, in particular, extension lengths from the first, second, and third, and fourth channel regions CHa, CHb, CHc, and CHd to the drain region D may increase. Therefore, the area of portions of the first, second, third, and fourth active regions 110*a*, 110*b*, 110*c*, and 110*d* overlapping the first, second, third, and fourth gate structures 120*a*, 120*b*, 120*c*, and 120*d* in the vertical direction (the Z direction) causing gate induced drain leakage (GIDL) may decrease, without increasing the total area occupied by each of the first, second, third, and fourth active regions 110*a*, 110*b*, 110*c*, and 110*d*. Therefore, the IC device 100 according to various embodiments may have improved performance and reliability, while having a high degree of integration, by preventing deterioration of breakdown voltage (BV) due to GIDL.

Figure 6:
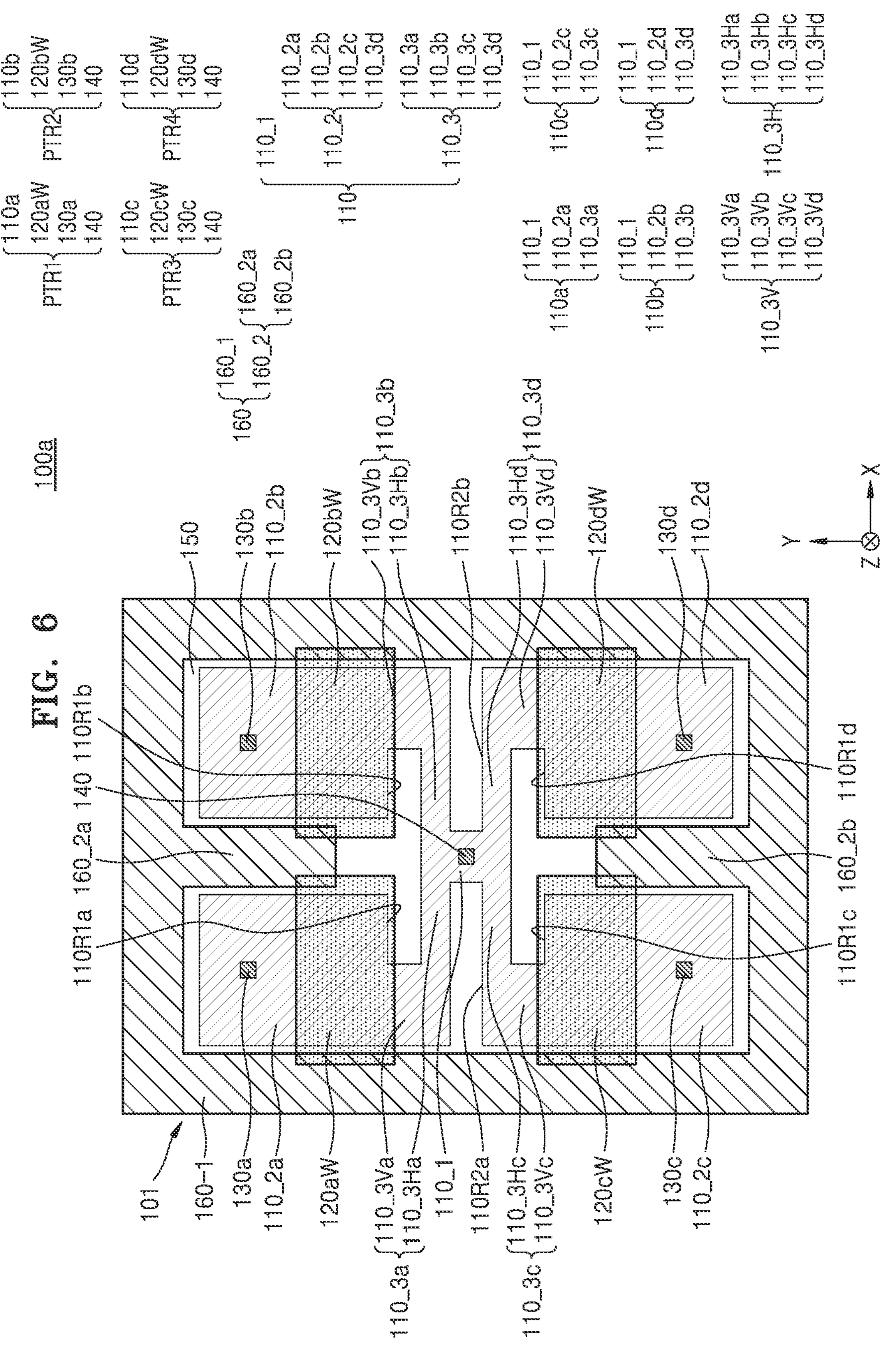
FIG. 6 is a layout diagram illustrating a pass transistor included in an IC device according to some embodiments.

FIG. 6 is a layout diagram illustrating a pass transistor included in an IC device 100*a* according to various embodiments.

Referring to FIG. 6, the IC device 100*a* may include the substrate 101 and a first gate structure 120*a*W, a second gate structure 120*b*W, a third gate structure 120*c*W, and a fourth gate structure 120*d*W. The IC device 100*a* may be located in the peripheral circuit structure PS described above with reference to FIG. 3. The IC device 100*a* may include the first, second, third, and fourth gate structures 120*a*W, 120*b*W, 120*c*W, and 120*d*W, instead of the first, second, third, and fourth gate structures 120*a*, 120*b*, 120*c*, and 120*d* included in the IC device 100 shown in FIG. 4.

The first, second, third, and fourth gate structures 120*a*W, 120*b*W, 120*c*W, and 120*d*W may be disposed on the substrate 101 and spaced apart from each other. In an embodiment, the first gate structure 120*a*W may be disposed on the first active region 110*a* of the substrate 101, the second gate structure **120*b*W may be disposed on the second active region 110*b* of the substrate 101, the third gate structure 120*c*W may be disposed on the third active region 110*c* of the substrate 101, and the fourth gate structure 120*d*W may be disposed on the fourth active region 110*d* of the substrate 101 and spaced apart from each other. In an embodiment, the first, second, third, and fourth gate structures 120*a*W, 120*b*W, 120*c*W, and 120*d*W may extend to the first, second, third, and fourth base active regions 110_2*a* and 110_2*b*, 110_2*c*, and 110_2*d* and the connection extended active region 110_3V but may be arranged to be spaced apart from each other. For example, each of the first, second, third, and fourth gate structures 120*a*, 120*b*, 120*c*, and 120*d* may be located not to overlap the central active region 110_1 and the refraction extended active region 110_3H in the vertical direction (the Z direction). In an embodiment, each of the first, second, third, and fourth gate structures 120*a*, 120*b*, 120*c*, and 120*d* may overlap one portion of the connection extended active region 110_3V in the vertical direction (the Z direction) but may not overlap the remaining portion thereof in the vertical direction (the Z direction). For example, the first, second, third, and fourth gate structures 120*a*, 120*b*, 120*c*, and 120*d* may overlap portions of the first, second, third, and fourth reduction holes 110R1*a*, 110R1*b*, 110R1*c*, and 110R1*d*** in the vertical direction (the Z direction), respectively, but may not overlap the remaining portions thereof in the vertical direction (the Z direction).

FIGS. 7A, 7B, 8A, 8B, 9A, 9B, 10A, and 10B are layout diagrams illustrating pass transistors included in IC devices **100*b*, 100*c*, 100*d*, 100*e*, 100*f*, 100*g*, 102, and 102*a*** according to some embodiments.

Figure 7A:
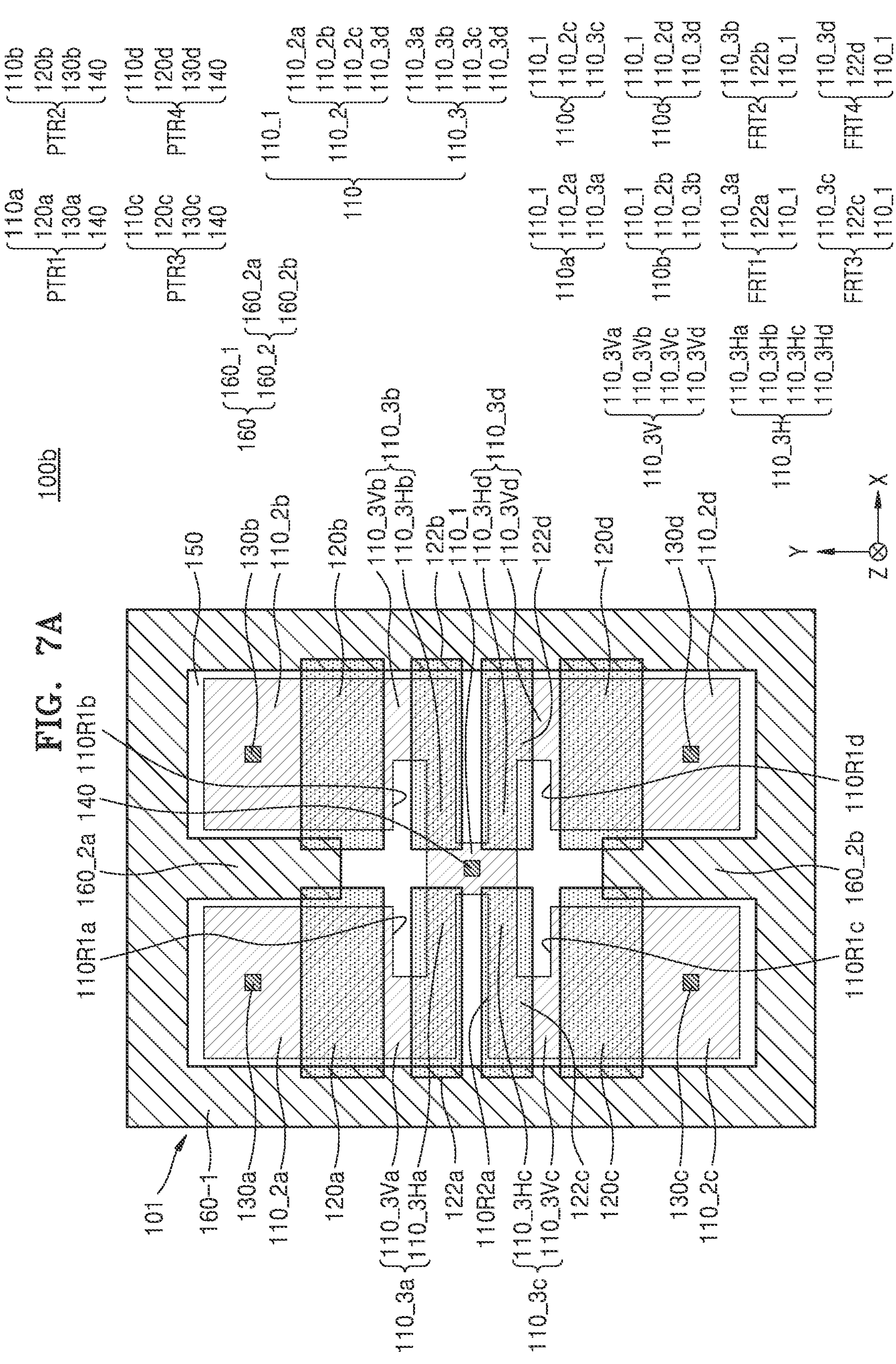
FIGS. 7A, 7B, 8A, 8B, 9A, 9B, 10A, 10B, 10C, and 10D are layout diagrams illustrating pass transistors included in IC devices according to some embodiments.

Referring to FIG. 7A, the IC device **100*b* may include the substrate 101 and the first, second, third, and fourth gate structures 120*a*, 120*b*, 120*c*, and 120*d*. The IC device 100*b* may be located in the peripheral circuit structure PS described above with reference to FIG. 3. The IC device 100*b* may further include a first field relaxation gate structure 122*a*, a second field relaxation gate structure 122*b*, a third field relaxation gate structure 122*c*, and a fourth field relaxation gate structure 122*d*, which are not included in the IC device 100 shown in FIG. 4. Each of the first, second, third, and fourth field relaxation gate structures 122*a*, 122*b*, 122*c*, and 122*d* may include a field relaxation gate dielectric film and a field relaxation gate electrode disposed on the field relaxation gate dielectric film, similarly to the first, second, third, and fourth gate dielectric films 120*al*, 120*bl*, 120*cl*, and 120*dl* and first, second, third, and fourth gate electrodes 120*ag*, 120*bg*, 120*cg*, and 120*dg* disposed on the first, second, third, and fourth gate dielectric films 120*al*, 120*bl*, 120*cl*, and 120*dl* respectively included in the first, second, third, and fourth gate structures 120*a*, 120*b*, 120*c*, and 120*d***.

In an embodiment, the first, second, third, and fourth field relaxation gate structures **122*a*, 122*b*, 122*c*, and 122*d* may be arranged to respectively overlap the first, second, third, and fourth refraction extended active regions 110_3Ha, 110_3Hb, 110_3Hc, and 110_3Hd in the vertical direction. In an embodiment, the first, second, third, and fourth field relaxation gate structures 122*a*, 122*b*, 122*c*, and 122*d* may be arranged to partially overlap the first, second, third, and fourth connection extended active regions. 110_3Va, 110_3Vb, 110_3Vc, and 110_3Vd in the vertical direction but may not overlap the first, second, third, and fourth base active regions 110_2*a*, 110_2*b*, 110_2*c*, and 110_2*d*** in the vertical direction.

The central active region 110_1, the first field relaxation gate structure **122*a*, and the first extended active region 110_3*a* may configure a first field relaxation transistor FRT1. The central active region 110_1, the second field relaxation gate structure 122*b*, and the second extended active region 110_3*b* may configure a second field relaxation transistor FRT2. The central active region 110_1, the third field relaxation gate structure 122*c*, and the third extended active region 110_3*c* may configure a third field relaxation transistor FRT3. The central active region 110_1, the fourth field relaxation gate structure 122*d*, and the fourth extended active region 110_3*d* may configure a fourth field relaxation transistor FRT4. The first, second, third, and fourth field relaxation transistors FRT1, FRT2, FRT3, and FRT4** may reduce a drain voltage, thereby reducing a hot carrier effect.

Figure 7B:
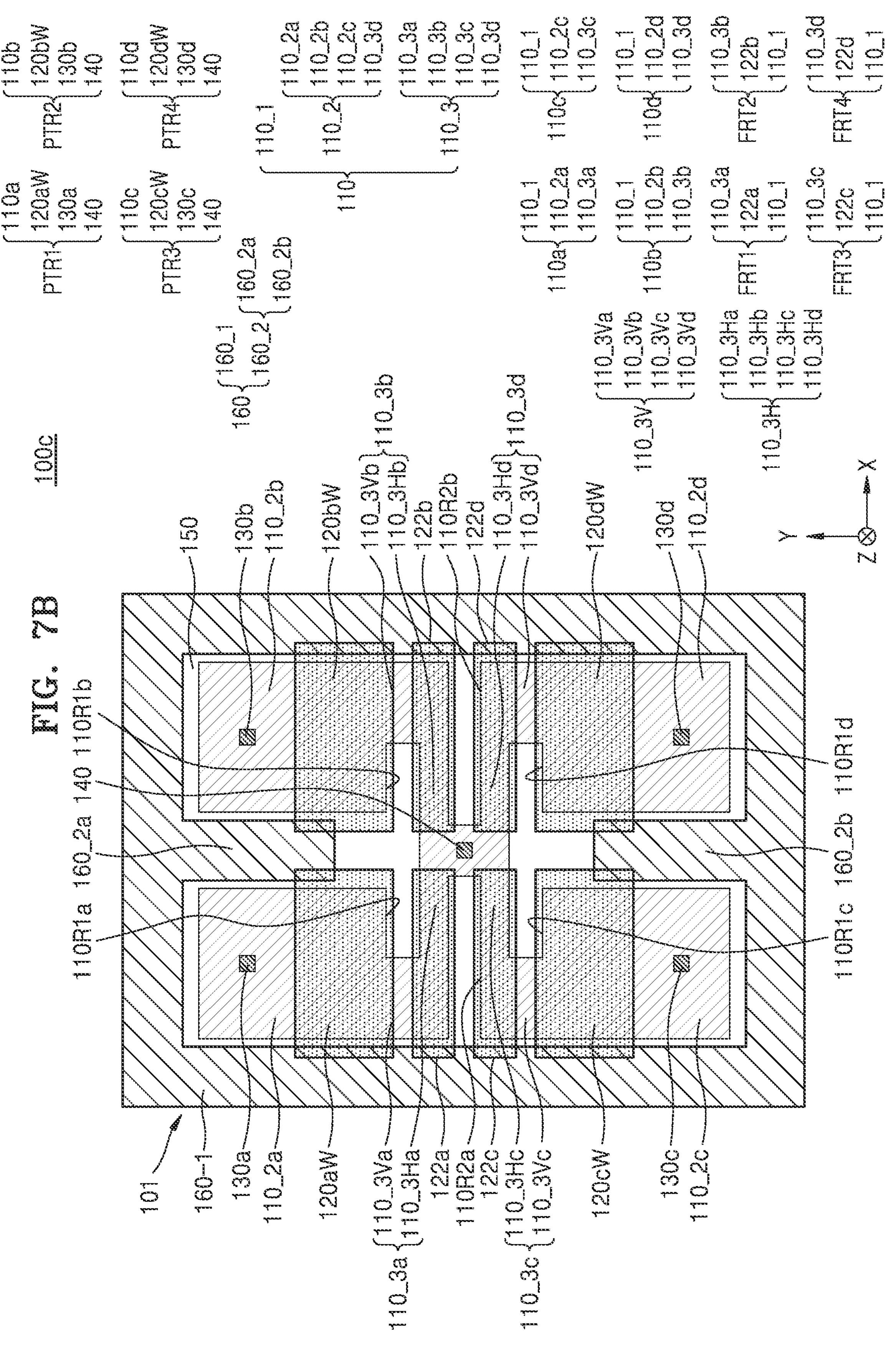

Referring to FIG. 7B, the IC device **100*c* may include the substrate 101 and the first, second, third, and fourth gate structures 120*a*W, 120*b*W, 120*c*W, and 120*d*W. The IC device 100*c* may be located in the peripheral circuit structure PS described above with reference to FIG. 3. The IC device 100*c* may include the first, second, third, and fourth gate structures 120*a*W, 120*b*W, 120*c*W, and 120*d*W included in the IC device 100*a*, instead of the first, second, third, and fourth gate structures 120*a*, 120*b*, 120*c*, and 120*d* included in the IC device 100 shown in FIG. 7**A.

Figure 8A:
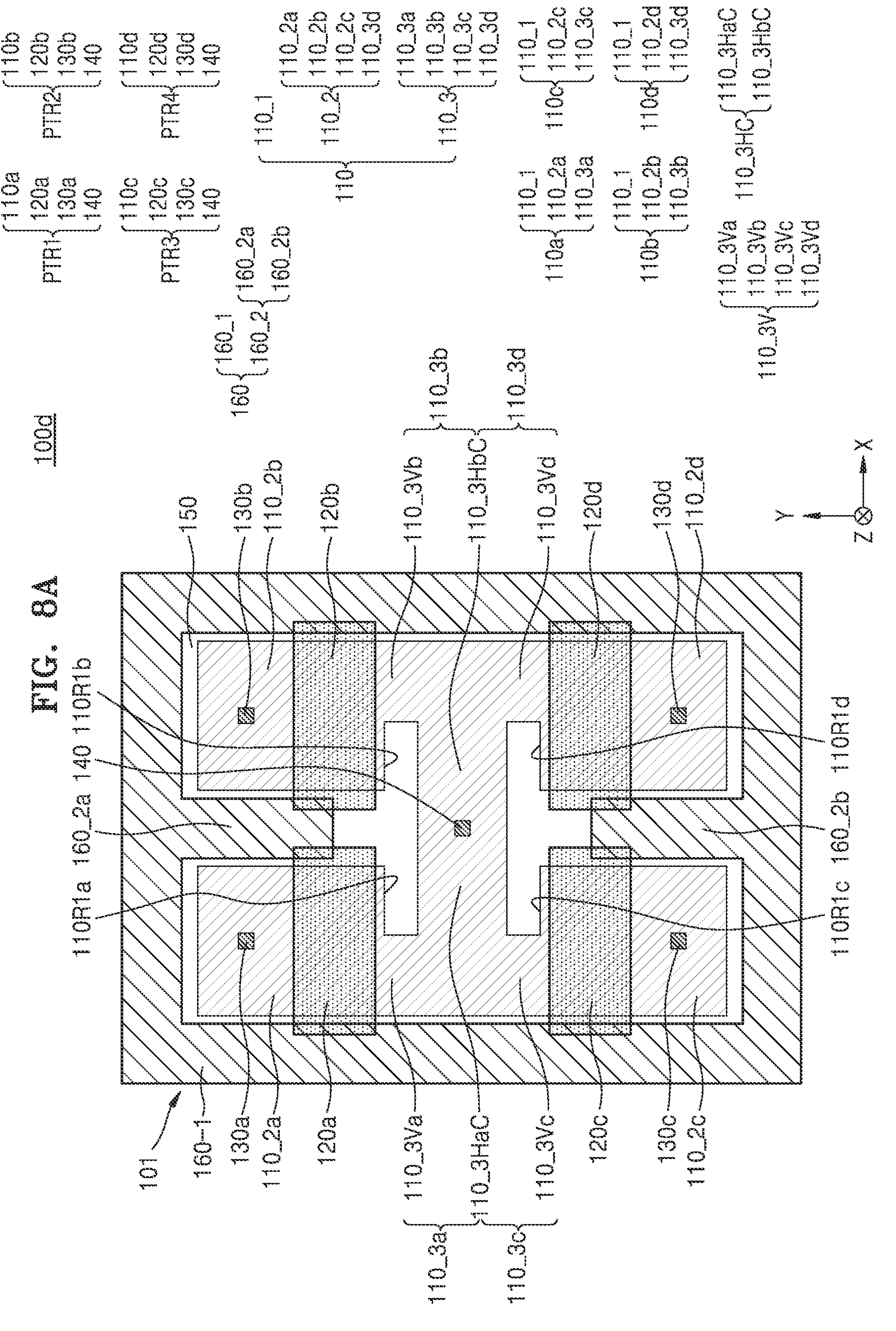

Referring to FIG. 8A, the IC device **100*d* may include the substrate 101 and the first, second, third, and fourth gate structures 120*a*, 120*b*, 120*c*, and 120*d*. The IC device 100*d* may be located in the peripheral circuit structure PS described above with reference to FIG. 3. The active region 110 included in the IC device 100*d* does not have the first and second shared holes 110R2*a* shown in FIG. 4 and may include a refraction extended active region 110_3HC, instead of the refraction extended active region 110_3H shown in FIG. 4. The refraction extended active region 110_3HC may include a first shared refraction extended active region 110_3HaC and a second shared refraction extended active region 110_3HbC. The first and third extended active regions 110_3*a* and 110_3*c* may share and include the first shared refraction extended active region 110_3HaC, rather than separately including the first and third refraction extended active regions 110_3Ha and 110_3Hc shown in FIG. 4, and the second and fourth extended active regions 110_3*b* and 110_3*d* may share and include the second shared refraction extended active region 110_3HbC, rather than separately including the second and fourth refraction extended active regions 110_3Hb and 110_3Hd**.

Figure 8B:
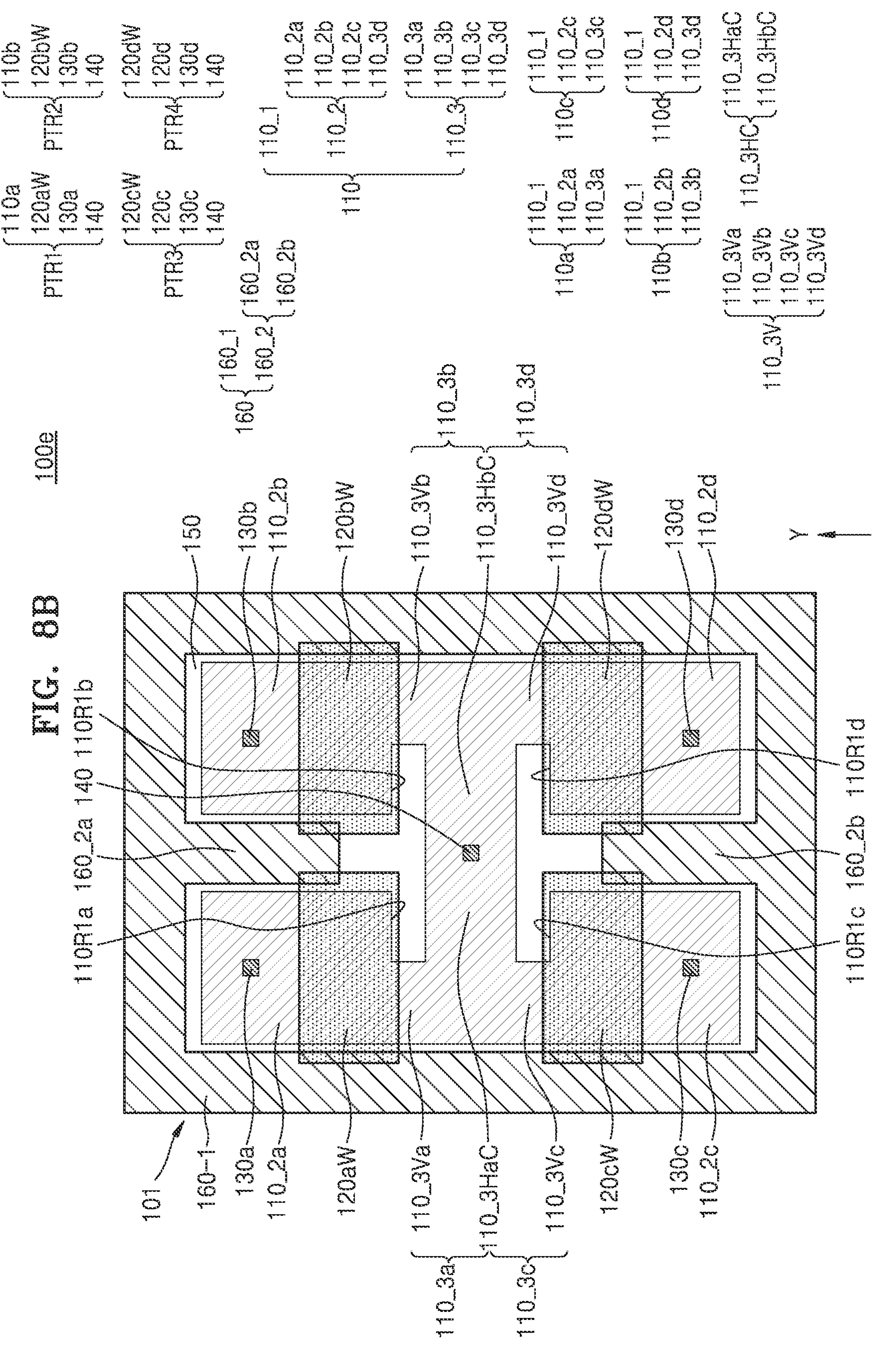

Referring to FIG. 8B, the IC device **100*e* may include the substrate 101 and the first, second, third, and fourth gate structures 120*a*W, 120*b*W, 120*c*W, and 120*d*W. The IC device 100*e* may be located in the peripheral circuit structure PS described above with reference to FIG. 3. The IC device 100*e* may include the first, second, third, and fourth gate structures 120*a*W, 120*b*W, 120*c*W, and 120*d*W included in the IC device 100*a* shown in FIG. 6, instead of including the first, second, third, and fourth gate structures 120*a*, 120*b*, 120*c*, and 120*d* included in the IC device 100*d* shown in FIG. 8**A.

Figure 9A:
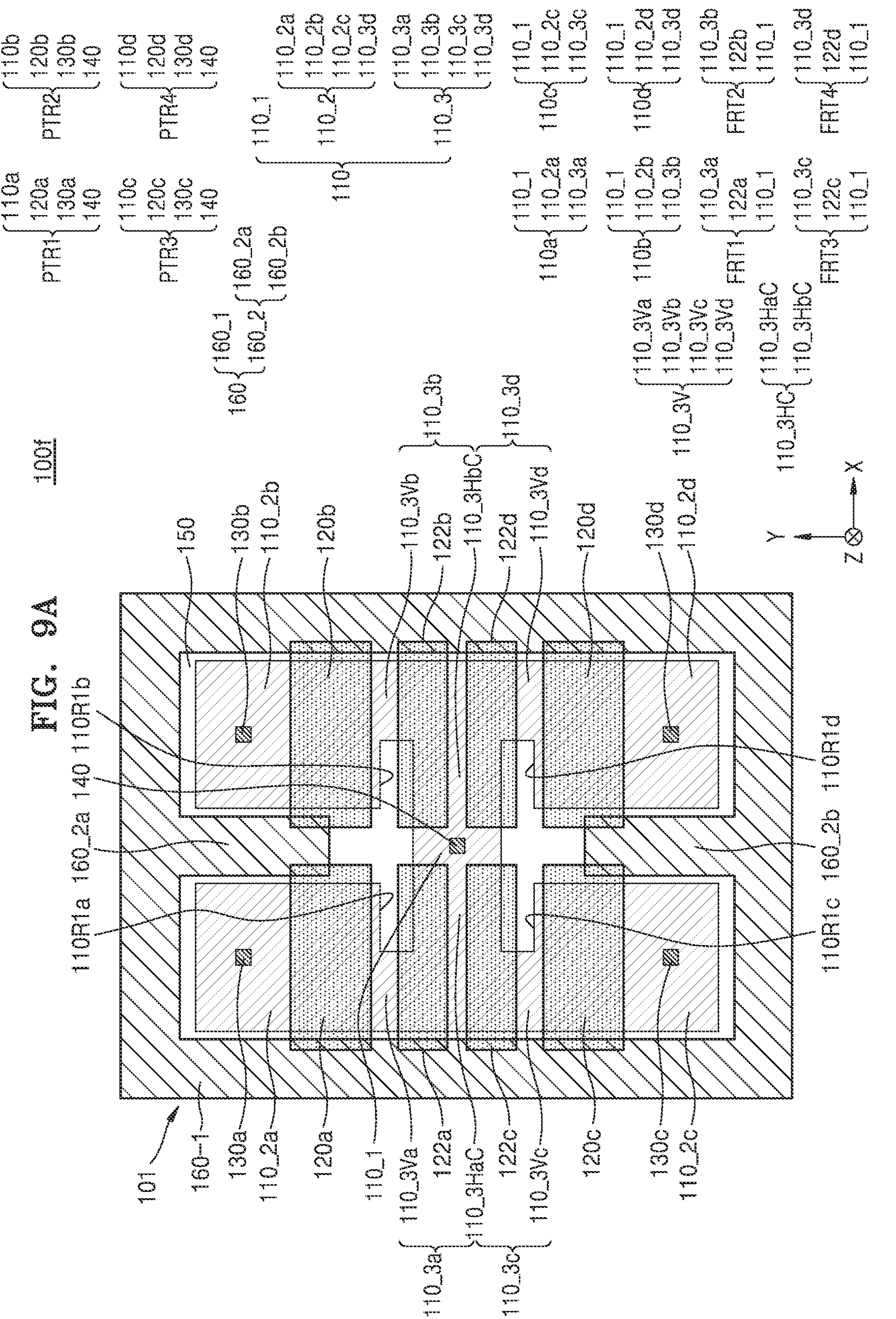

Referring to FIG. 9A, the IC device **100*f* may include the substrate 101 and the first, second, third, and fourth gate structures 120*a*, 120*b*, 120*c*, and 120*d*. The IC device 100*f* may be located in the peripheral circuit structure PS described above with reference to FIG. 3. The IC device 100*f* may further include the first, second, third, and fourth field relaxation gate structures 122*a*, 122*b*, 122*c*, and 122*d* shown in FIG. 7A, which are not included in the IC device 100*d* shown in FIG. 8**A.

Figure 9B:
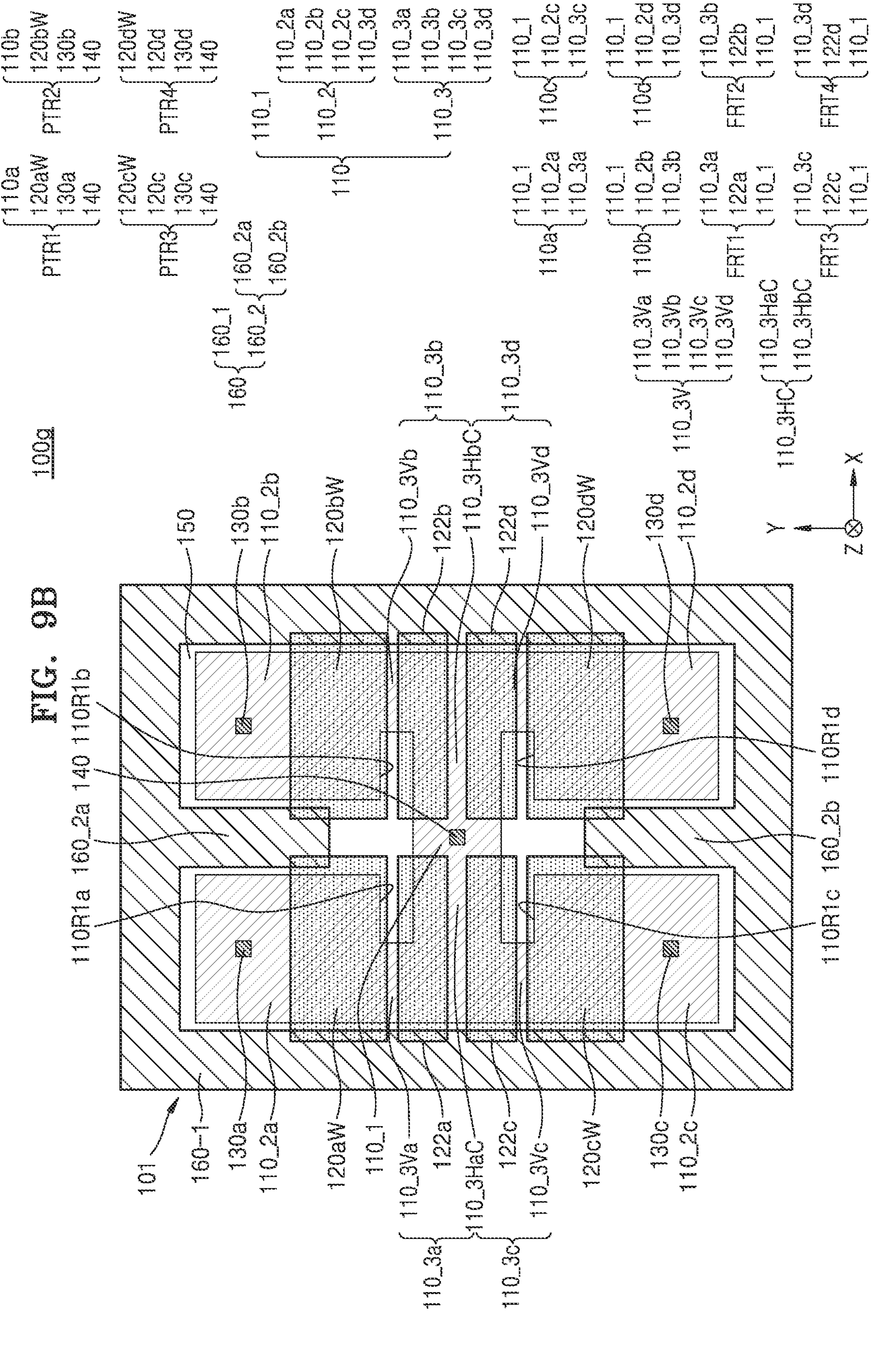

Referring to FIG. 9B, the IC device 100*g* may include the substrate 101 and the first, second, third, and fourth gate structures 120*a*W, 120*b*W, 120*c*W, and 120*d*W. The IC device 100*g* may be located in the peripheral circuit structure PS described above with reference to FIG. 3. The IC device 100*g* may include the first, second, third, and fourth gate structures 120*a*W, 120*b*W, 120*c*W, and 120*d*W included in the IC device 100*a* shown in FIG. 6, instead of the first, second, third, and fourth gate structures 120*a*, 120*b*, 120*c*, and 120*d* included in the IC device 100*d* shown in FIG. 9A.

Figure 10A:
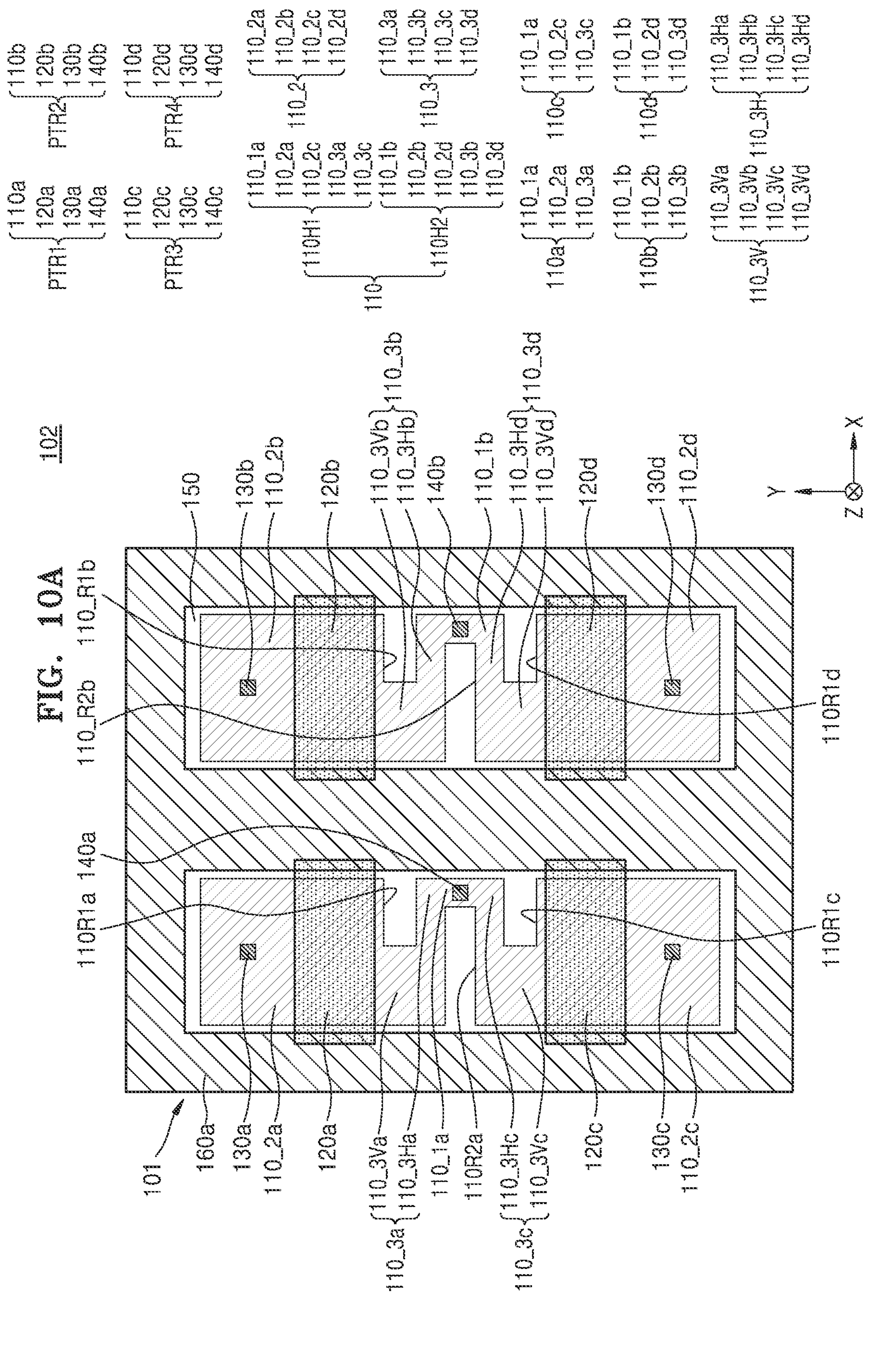

Referring to FIG. 10A, the IC device 102 may include the substrate 101 and the first, second, third, and fourth gate structures 120*a*, 120*b*, 120*c*, and 120*d*. The IC device 102 may be located in the peripheral circuit structure PS described above with reference to FIG. 3. Unlike in FIG. 4 in which the first, second, third, and fourth active regions 110*a*, 110*b*, 110*c*, and 110*d* included in the active region 110 of the IC device 100 are integrated, the active region 110 included in the IC device 102 includes a first separated active region 110H1 and a second separated active region 110H2 spaced apart from each other. The first separated active region 110H1 may include a first active region 110*a* and a third active region 110*c* that are integrally formed. The second separated active region 110H2 may include a second active region 110*b* and a fourth active region 110*d* that are integrally formed. The first active region 110*a* may include a first central active region 110_1*a*, a first base active region 110_2*a*, and a first extended active region 110_3*a*. The second active region 110*b* may include a second central active region 110_1*b*, a second base active region 110_2*b*, and a second extended active region 110_3*b*. The third active region 110*c* may include the first central active region 110_1*a*, a third base active region 110_2*c*, and a third extended active region 110_3*c*. The fourth active region 110*d* may include the second central active region 110_1*b*, a fourth base active region 110_2*d*, and a fourth extended active region 110_3*d*. The first central active region 110_1*a* may be shared by the first and third active regions 110*a* and 110*c*, and the second central active region 110_1*b* may be shared by the second and fourth active regions 110*b* and 110*d*. A first drain contact 140*a* may be connected to the drain region D (refer to FIG. 5B) of the first central active region 110_1*a*. A second drain contact 140*b* may be connected to the drain region D (refer to FIG. 5B) of the second central active region 110_1*b*.

The first separated active region 110H1 and the second separated active region 110H2 are illustrated as having the same shape and arranged in the first horizontal direction (the X direction) but embodiments are not limited thereto. In an embodiment, the first separated active region 110H1 may be linearly symmetrical to the second separated active region based on a first imaginary straight line extending in the second horizontal direction (the Y direction). An isolation region 160*a* may be located to surround the first separated active region 110H1 and the second separated active region 110H2 in a plan view. For example, the isolation region 160*a* may extend so that the first extended isolation region 160_2*a* contacts the second extended isolation region 160_2*b* of the isolation region 160 shown in FIG. 4.

Figure 10B:
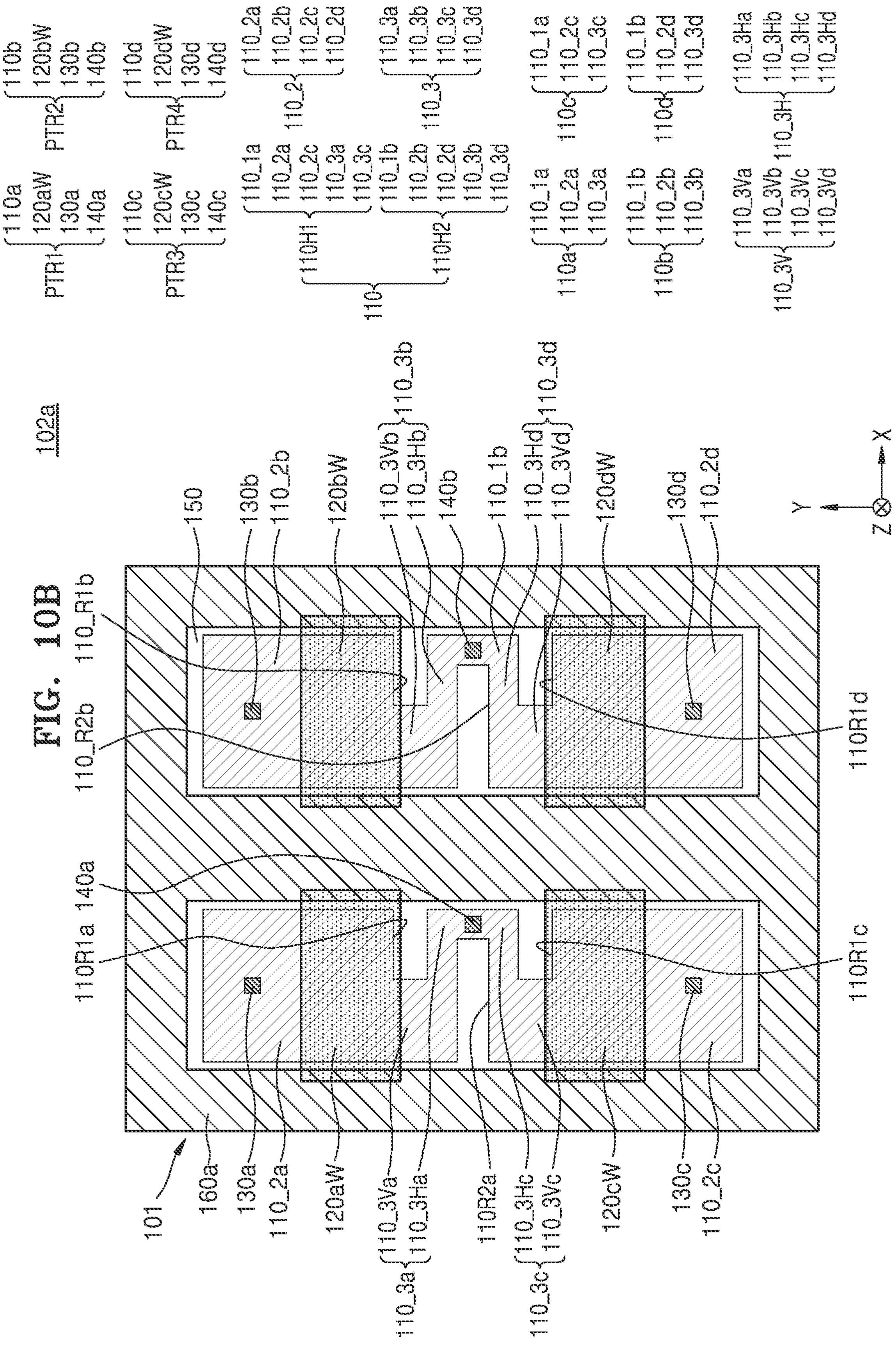

Referring to FIG. 10B, the IC device 102*a* may include the substrate 101 and the first, second, third, and fourth gate structures 120*a*W, 120*b*W, 120*c*W, and 120*d*W. The IC device 102*a* may be located in the peripheral circuit structure PS described above with reference to FIG. 3. The IC device 102*a* may include the first, second, third, and fourth gate structures 120*a*W, 120*b*W, 120*c*W, and 120*d*W shown in FIG. 7B, instead of the first, second, third, and fourth gate structures 120*a*, 120*b*, 120*c*, and 120*d* included in the IC device 100 shown in FIG. 10A.

Figure 10C:
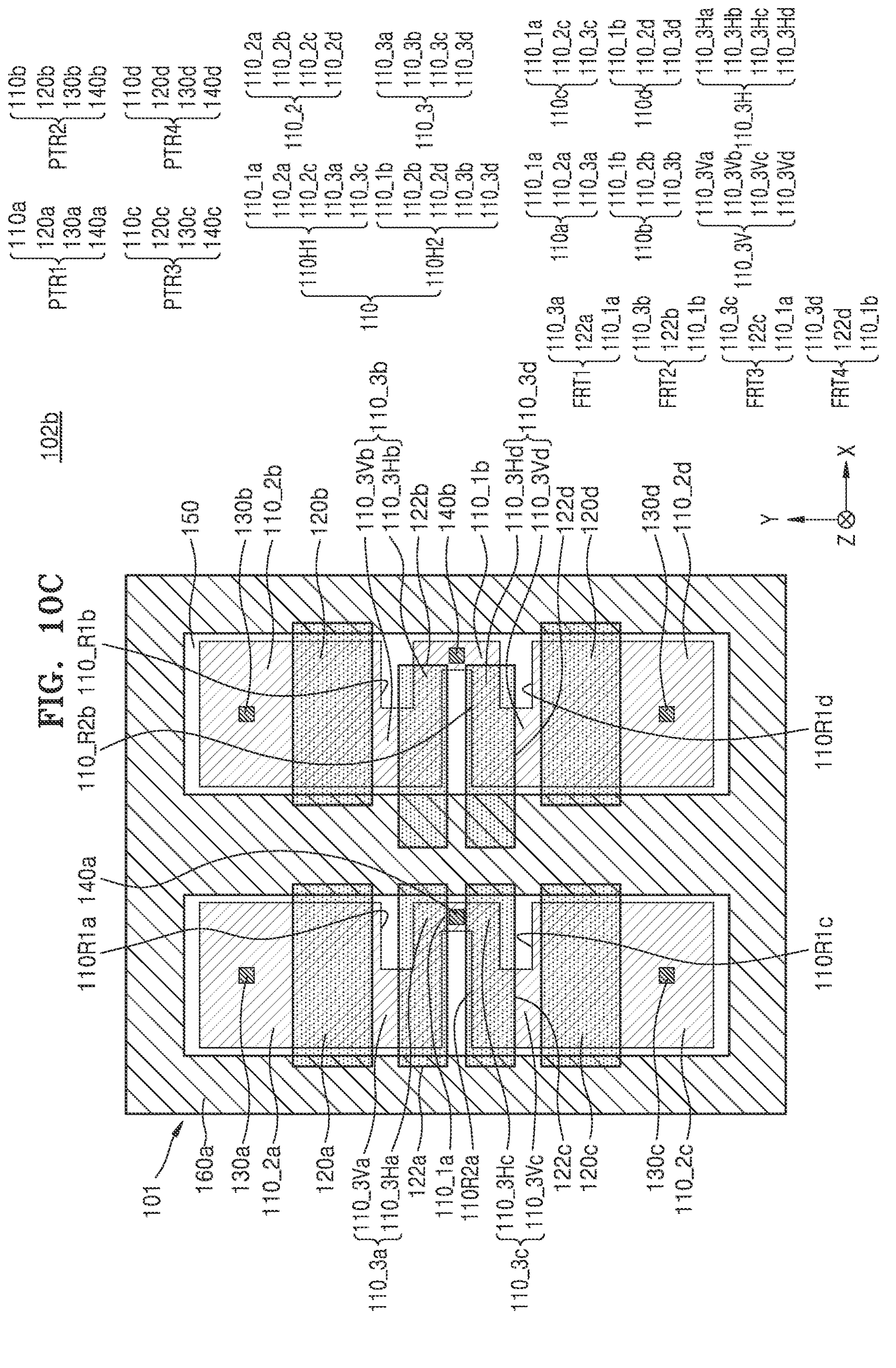

Referring to FIG. 10C, the IC device 102*b* may include the substrate 101 and the first, second, third, and fourth gate structures 120*a*, 120*b*, 120*c*, and 120*d*. The IC device 102*b* may be located in the peripheral circuit structure PS described above with reference to FIG. 3. The IC device 102*b* may include the first, second, third, and fourth field relaxation gate structures 122*a*, 122*b*, 122*c*, and 122*d* shown in FIG. 7A, which are not included in the IC device 102 shown in FIG. 10A.

Figure 10D:
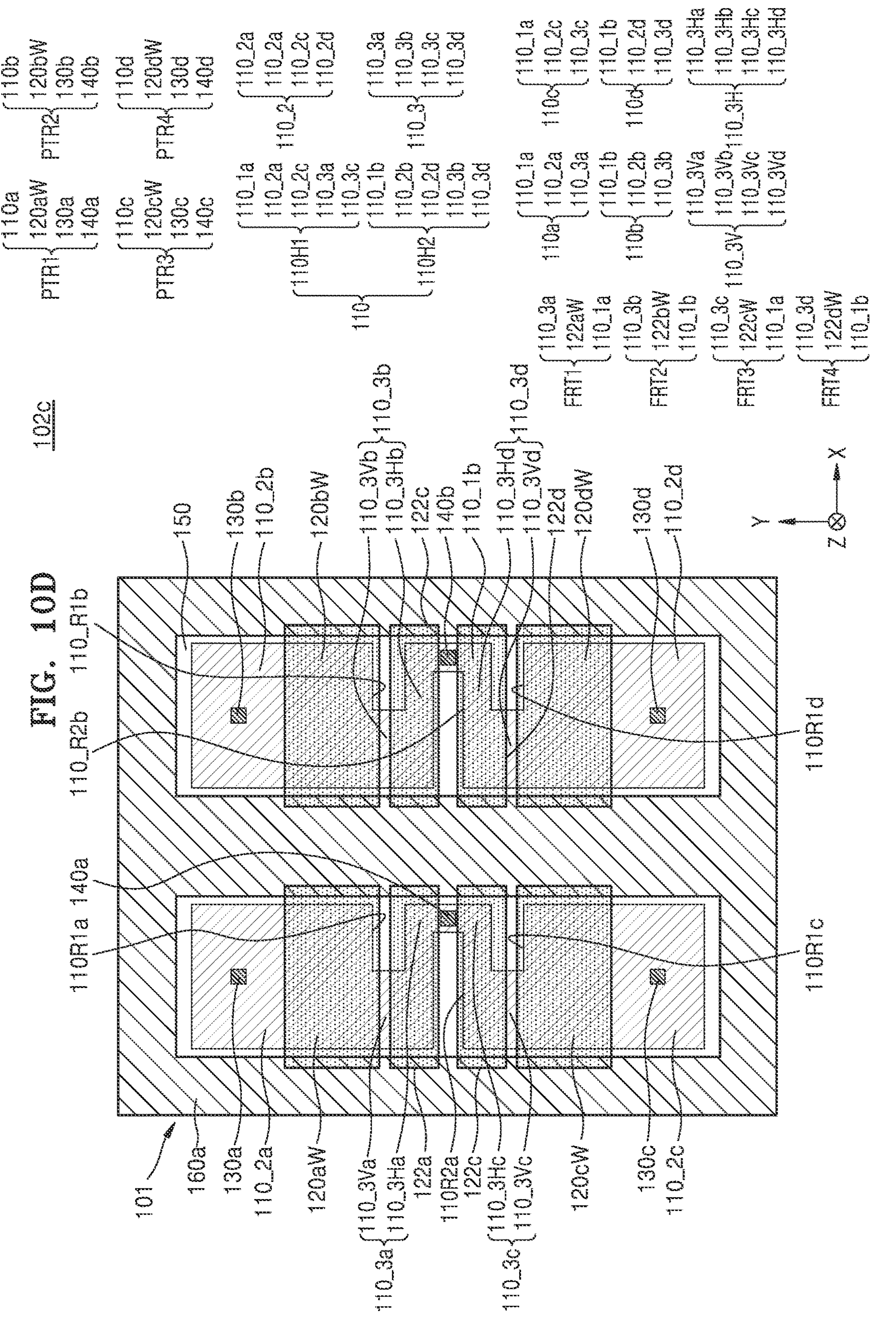

Referring to FIG. 10D, the IC device 102*c* may include the substrate 101 and the first, second, third, and fourth gate structures 120*a*W, 120*b*W, 120*c*W, and 120*d*W. The IC device 102*c* may be located in the peripheral circuit structure PS described above with reference to FIG. 3. The IC device 102*c* may further include the first, second, third, and fourth field relaxation gate structures 122*a*, 122*b*, 122*c*, 122*d*) shown in FIG. 7A, which are not included in the IC device 102*b* shown in FIG. 10A.

Figure 11:
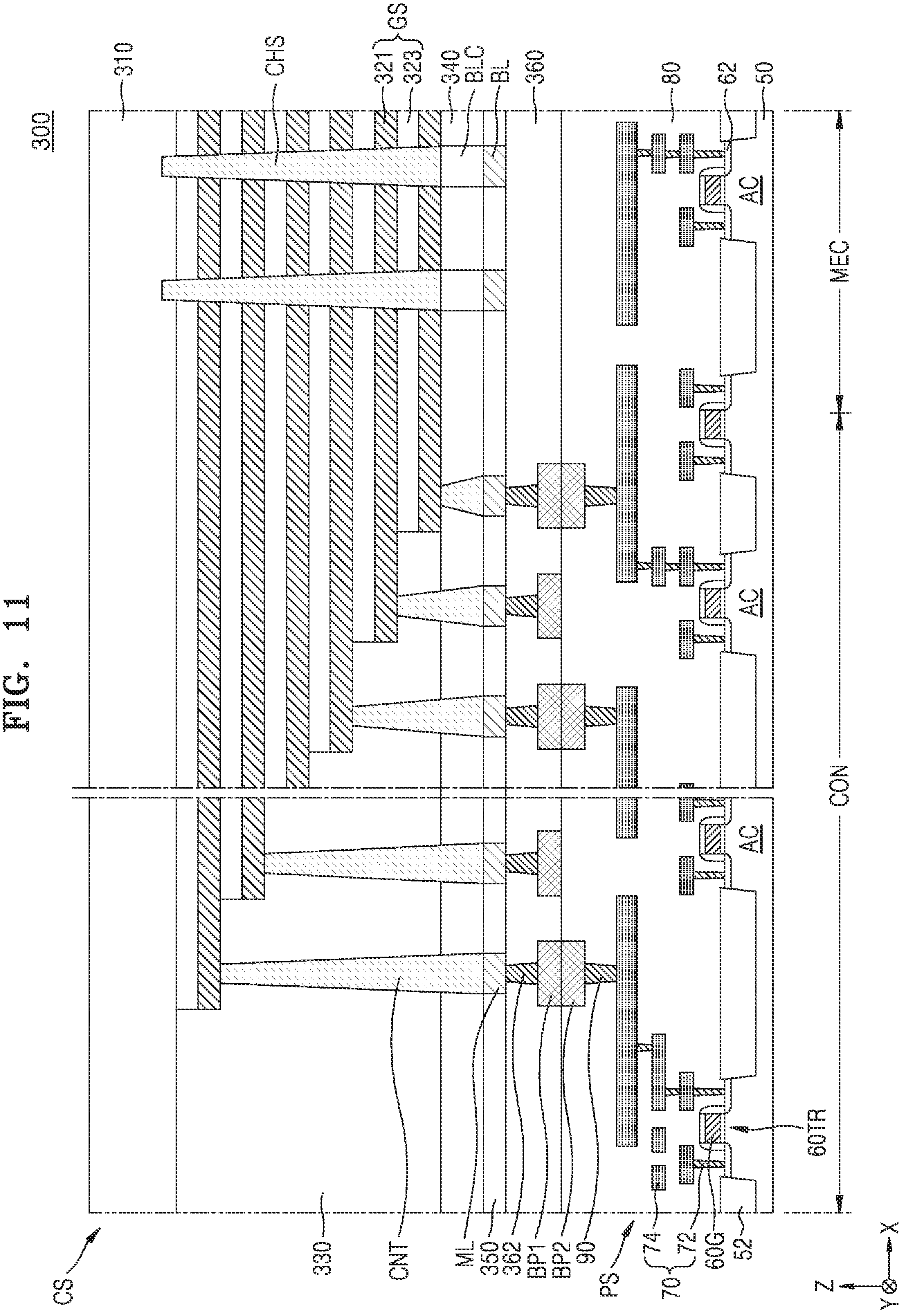
FIGS. 11 and 12 are cross-sectional views respectively illustrating IC devices according to some embodiments.
Figure 12:
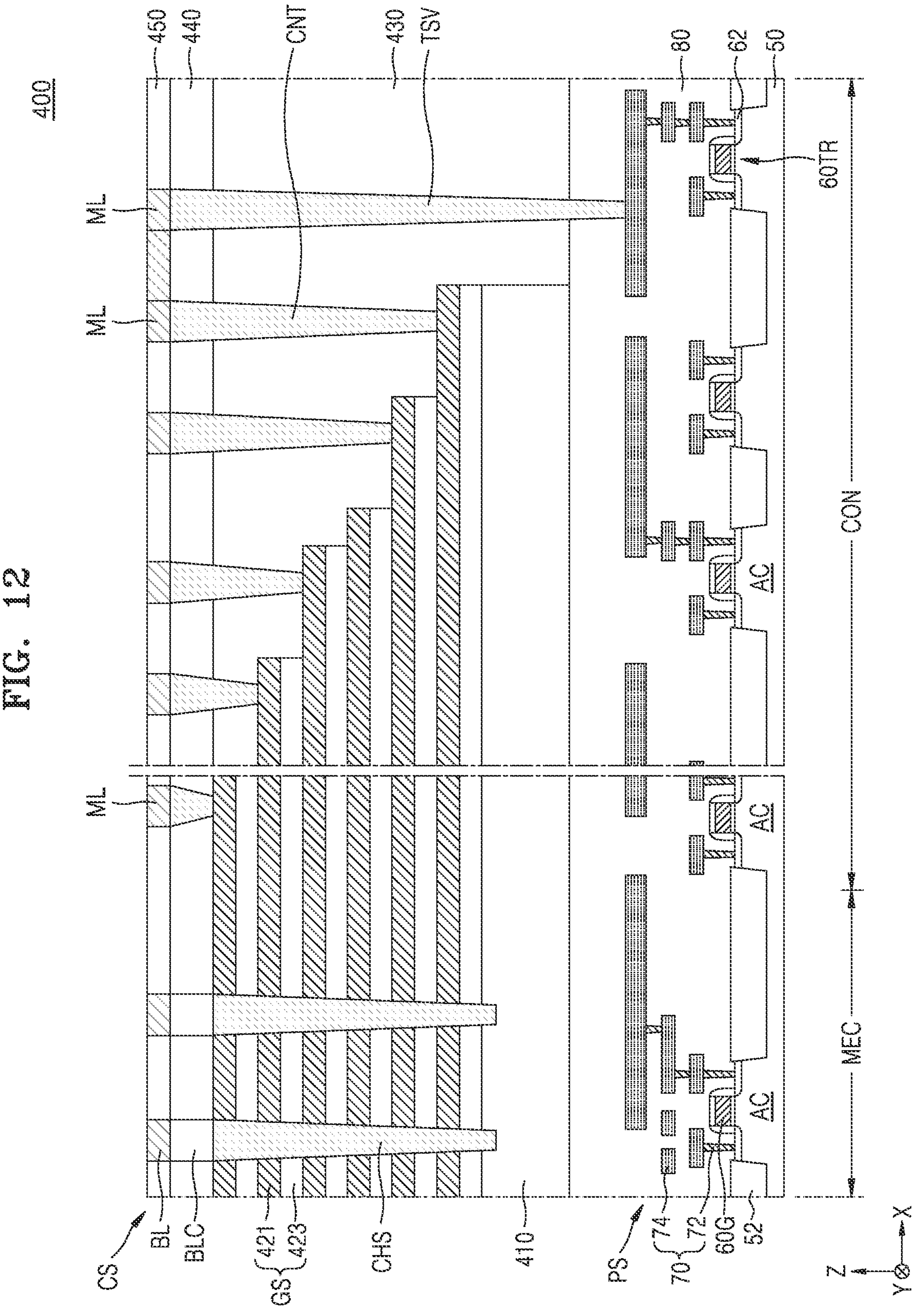

FIGS. 11 and 12 are cross-sectional views respectively showing IC devices 300 and 400 according to some embodiments.

Referring to FIG. 11, the IC device 300 may include a cell array structure CS and a peripheral circuit structure PS overlapping in the vertical direction (the Z direction). In an embodiment, the cell array structure CS may be located at a vertical level higher than that of the peripheral circuit structure PS. The cell array structure CS may include a memory cell region MEC and a connection region CON located on one side of the memory cell region MEC in the first horizontal direction (the X direction).

In an embodiment, the IC device 100 may have a chip-to-chip (C2C) structure. The C2C structure may be obtained by forming the cell array structure CS on a first wafer, forming the peripheral circuit structure PS on a second wafer, different from the first wafer, and then connecting the cell array structure CS to the peripheral circuit structure by a bonding method. For example, the bonding method may refer to a method of bonding a first bonding pad BP1 of the cell array structure CS to a second bonding pad BP2 of the peripheral circuit structure PS to be electrically connected to each other. In embodiments, when the first bonding pad BP1 and the second bonding pad BP2 include copper (Cu), the bonding method may be a Cu—Cu bonding method. In other embodiments, each of the first bonding pad BP1 and the second bonding pad BP2 may include aluminum (Al) or tungsten (W).

The peripheral circuit structure PS may include a substrate 50, a peripheral circuit transistor 60TR disposed on the substrate 50, and a peripheral circuit wiring structure 70.

The substrate 50 may include a semiconductor substrate. For example, the substrate 50 may include Si, Ge, or SiGe. An active region AC may be defined in the substrate 50 by a device isolation film 54, and a plurality of peripheral circuit transistors 60TR may be formed on the active region AC. The peripheral circuit transistors 60TR may include a peripheral circuit gate 60G and source/drain regions 62 disposed in portions of the substrate 50 on both sides of the peripheral circuit gate 60G. In an embodiment, the peripheral circuit transistors 60TR may include at least one of the structures of the first, second, third, and fourth pass transistors PTR1, PTR2, PTR3, and PTR4 included in the IC devices 100, 100*a*, 100*b*, 100*c*, 100*d*, 100*e*, 100*f*, 100*g*, 102, 102*a*, 102*b*, and 102*c* described above with reference to FIGS. 4 to 10D.

A plurality of peripheral circuit wiring structures 70 may include a plurality of peripheral circuit contacts 72 and a plurality of peripheral circuit wiring layers 74. At least some of the peripheral circuit wiring layers 74 may be configured to be electrically connectable to the peripheral circuit transistor 60TR. The peripheral circuit contacts 72 may be configured to interconnect some selected from among the peripheral circuit transistors 60TR and the peripheral circuit wiring layers 74 to each other. The peripheral circuit transistors 60TR and the peripheral circuit wiring structures 70 included in the peripheral circuit structure PS may be covered with an interlayer insulating layer 80. The interlayer insulating layer 80 may include a silicon oxide film, a silicon nitride film, a SiON film, a SiOCN film, or combinations thereof.

A plurality of second bonding pads BP2 may be arranged on the interlayer insulating layer 80. The second bonding pads BP2 may be connected to the peripheral circuit wiring structures 70 through the second bonding vias 90. In an embodiment, an upper surface of the second bonding pad BP2 may be coplanar with an upper surface of the interlayer insulating layer 80. The second bonding pad BP2 may include a conductive material including copper (Cu), gold (Au), silver (Ag), aluminum (Al), tungsten (W), titanium (Ti), tantalum (Ta), or combinations thereof.

The cell array structure CS may include a cell stack structure GS disposed on a substrate 310. The cell stack structure GS may include a plurality of gate electrodes 321 and a plurality of insulating films 323 alternately arranged in the vertical direction. The gate electrodes 321 may include, for example, tungsten, nickel, cobalt, tantalum, tungsten nitride, titanium nitride, tantalum nitride, or combinations thereof. The insulating films 323 may include silicon oxide, silicon nitride, or silicon oxynitride. The gate electrodes 321 may correspond to the ground select line GSL, the word line WL, and at least one string select line SSL configuring the memory cell string MS (refer to FIG. 2). For example, in the drawing, the uppermost one gate electrode 321 may function as the ground select line GSL, the lowermost two gate electrodes 321 in the drawing may function as string select lines SSL, and the remaining gate electrode 321 may function as a word line WL. Accordingly, the memory cell string MS including the ground select transistor GST, the string select transistor SST, and the memory cell transistors MC1, MC2, . . . , MCn−1, and MCn connected in series therebetween may be provided.

The cell stack structure GS may extend to have a length decreasing in the first horizontal direction (the X direction) in a direction away from the substrate 310 in the connection region CON. That is, the cell stack structure GS may have a step shape. For example, as the cell stack structure GS is away from the peripheral circuit structure PSS in the connection region CON, the cell stack structure GS may extend to have a length elongated in the first horizontal direction (the X direction).

The substrate 310 and the cell stack structure GS may be covered by the cover insulating film 330. The cover insulating film 330 may include a silicon oxide layer, a silicon nitride layer, or combinations thereof.

The channel structures CHS may extend in the vertical direction through the cell stack structure GS in the memory cell region MEC. The channel structures CHS may be arranged to be apart from each other at a predetermined interval. The channel structures CHS may be arranged in a zigzag shape or a staggered shape. In an embodiment, the channel structures CHS may extend to the inside of the substrate 310. In another embodiment, the channel structures CHS may be disposed to contact a lower surface of the substrate 310.

Each of the channel structures CHS may be disposed in a channel hole passing through the cell stack structure GS. Each of the channel structures CHS may include a gate insulating film, a channel layer, a buried insulating film, and a conductive plug. The gate insulating film and the channel layer may be sequentially disposed on sidewalls of the channel hole. The buried insulating film filling a remaining space of the channel hole may be located on the channel layer. The conductive plug may be disposed in contact with the channel layer to block an entrance of the channel hole.

The channel structures CHS may contact a plurality of bit line contacts BLC on a lower surface thereof. The bit line contacts BLC may extend in the vertical direction (the Z direction) through the first insulating film 340 and may be insulated from each other by the first insulating film 340. The bit line contacts BLC may contact the bit lines BL on a lower surface thereof. The bit lines BL may extend in the vertical direction (the Z direction) through the second insulating film 350 and may be insulated from each other by the second insulating film 350. Each of the channel structures CHS may be connected to a corresponding one of the bit lines BL through the bit line contact BLC.

The contact structures CNT may extend in the vertical direction (the Z direction) through the cover insulating film 330 and the first insulating film 340 on the connection region CON. The contact structures CNT may electrically connect the gate electrodes 321 to the wiring layers ML. For example, upper surfaces of the contact structures CNT may contact the gate electrodes 321, and lower surfaces of the contact structures CNT may contact the wiring layers ML. The wiring layers ML may extend in the vertical direction (the Z direction) through the second insulating film 350 and may be insulated from each other by the second insulating film 350. The wiring layers ML may contact the first bonding vias 362 on the lower surface. The first bonding vias 362 may extend in the vertical direction (the Z direction) through the interlayer insulating layer 360 and may be insulated from each other by the interlayer insulating layer 360. The first bonding via 362 may contact the first bonding pad BP1 on a lower surface thereof.

Among the peripheral circuit transistors 60TR, the peripheral circuit transistors 60TR corresponding to the first, second, third, and fourth pass transistors PTR1, PTR2, PTR3, and PTR4 included in the IC devices 100, 100*a*, 100*b*, 100*c*, 100*d*, 100*e*, 100*f*, 100*g*, 102, 102*a*, 102*b*, and 102*c* described above with reference to FIGS. 4 to 10D may be electrically connected to the gate electrodes 321 through the contact structures CNT. For example, among the peripheral circuit transistors 60TR, the drain region D (refer to FIG. 5B) of the first, second, third, and fourth pass transistors PTR1, PTR2, PTR3, and PTR4 included in the IC devices 100, 100*a*, 100*b*, 100*c*, 100*d*, 100*e*, 100*f*, 100*g*, 102, 102*a*, 102*b*, and 102*c* described above with reference to FIGS. 4 to 10D may be electrically connected to the gate electrodes 321 through the contact structures CNT to transfer an operating voltage. In an embodiment, the drain region D (refer to FIG. 5B) of the first, second, third, and fourth pass transistors PTR1, PTR2, PTR3, and PTR4 may be electrically connected to the contact structure CNT corresponding thereto through the peripheral circuit wiring structure 70, the second bonding via 90, the second bonding pad BP2, the first bonding pad BP1, the first bonding via 362, and the wiring layer ML. The peripheral circuit contacts 72 connected to the drain region D (refer to FIG. 5B) of the first, second, third, and fourth pass transistors PTR1, PTR2, PTR3, and PTR4 may be the drain contact 140, the first drain contact 140*a*, or the second drain contact 140*b* shown in FIGS. 4 to 10D.

Referring to FIG. 12, the IC device 400 may include the cell array structure CS and the peripheral circuit structure PS. Each component of the IC device 400 of FIG. 12 is similar to each component of the IC device 300 described above with reference to FIG. 11, and thus, differences therebetween are mainly described hereinafter.

The peripheral circuit structure PS of the IC device 400 may be substantially the same as or similar to the peripheral circuit structure PS of the IC device 300 described above with reference to FIG. 11.

The cell array structure CS may include a cell stack structure GS and a cell substrate 410 located between the cell stack structure GS and the peripheral circuit structure PS. In an embodiment, the cell substrate 410 may include a semiconductor material, such as polysilicon.

The cell stack structure GS may be disposed on the cell substrate 410. The cell stack structure GS may include a plurality of gate electrodes 421 and a plurality of insulating films 423 alternately arranged in the vertical direction. The cell stack structure GS may extend to have a length decreasing in the first horizontal direction (the X direction) in the connection region CON, in a direction away from the peripheral circuit structure PS and the substrate 410. That is, the cell stack structure GS may have a step shape. The cell stack structure GS may be covered by the cover insulating layer 430.

The channel structures CHS may extend in the vertical direction (the Z direction) through the cell stack structure GS in the memory cell region MEC. A configuration of the channel structures CHS may be substantially the same as or similar to the configuration of the channel structures CHS described above with reference to FIG. 11.

In an embodiment, the channel structures CHS may be disposed extending to the inside of the cell substrate 410. In another embodiment, the channel structure CHS may be disposed to contact a lower surface of the cell substrate 410.

The channel structures CHS may be in contact with the bit line contacts BLC on an upper surface thereof. The bit line contacts BLC may extend in the vertical direction (the Z direction) through the first insulating layer 440 and may be insulated from each other by the first insulating layer 440. The bit line contacts BLC may be in contact with the bit lines BL on an upper surface thereof. The bit lines BL may extend in the vertical direction (the Z direction) through the second insulating layer 450 and may be insulated from each other by the second insulating layer 450. Each of the channel structures CHS may be connected to a corresponding one of the bit lines BL through the bit line contact BLC.

The contact structures CNT may extend in a vertical direction (the Z direction) through the cover insulating film 330 and the first insulating film 340 on the connection region CON. The contact structures CNT may contact the wiring layers ML on an upper surface thereof. The wiring layers ML may extend in the vertical direction (the Z direction) through the second insulating film 450 and may be insulated from each other by the second insulating film 450.

A through-electrode TSV may extend in the vertical direction (the Z direction) through the first insulating film 440, the cover insulating film 430, and the interlayer insulating layer 80 and may electrically connect the wiring layer ML to the peripheral circuit wiring layer 74. The through-electrode TSV may be electrically connected to the gate electrodes 421 through the wiring layer ML and the contact structure CNT.

Among the peripheral circuit transistors 60TR, the peripheral circuit transistors 60TR corresponding to the first, second, third, and fourth pass transistors PTR1, PTR2, PTR3, and PTR4 included in the IC devices 100, 100*a*, 100*b*, 100*c*, 100*d*, 100*e*, 100*f*, 100*g*, 102, 102*a*, 102*b*, and 102*c* described above with reference to FIGS. 4 to 10D may be electrically connected to the gate electrodes 321 through the through-electrode TSV, the wiring layer ML, and the contact structure CNT. For example, among the peripheral circuit transistors 60TR, the drain region D (refer to FIG. 5B) of the first, second, third, and fourth pass transistors PTR1, PTR2, PTR3, and PTR4 included in the IC devices 100, 100*a*, 100*b*, 100*c*, 100*d*, 100*e*, 100*f*, 100*g*, 102, 102*a*, 102*b*, and 102*c* described above with reference to FIGS. 4 to 10D may be electrically connected to the gate electrodes 321 through the through-electrode TSV, the wiring layer ML, and the contact structure CNT to transfer an operating voltage. In an embodiment, the drain region D (refer to FIG. 5B) of the first, second, third, and fourth pass transistors PTR1, PTR2, PTR3, and PTR4 may be electrically connected to through-electrode TSV corresponding thereto through the peripheral circuit wiring structure 70. The peripheral circuit contacts 72 connected to the drain region D (refer to FIG. 5B) of the first, second, third, and fourth pass transistors PTR1, PTR2, PTR3, and PTR4 may be the drain contact 140, the first drain contact 140*a*, or the second drain contact 140*b* shown in FIGS. 4 to 10D.

Figure 13:
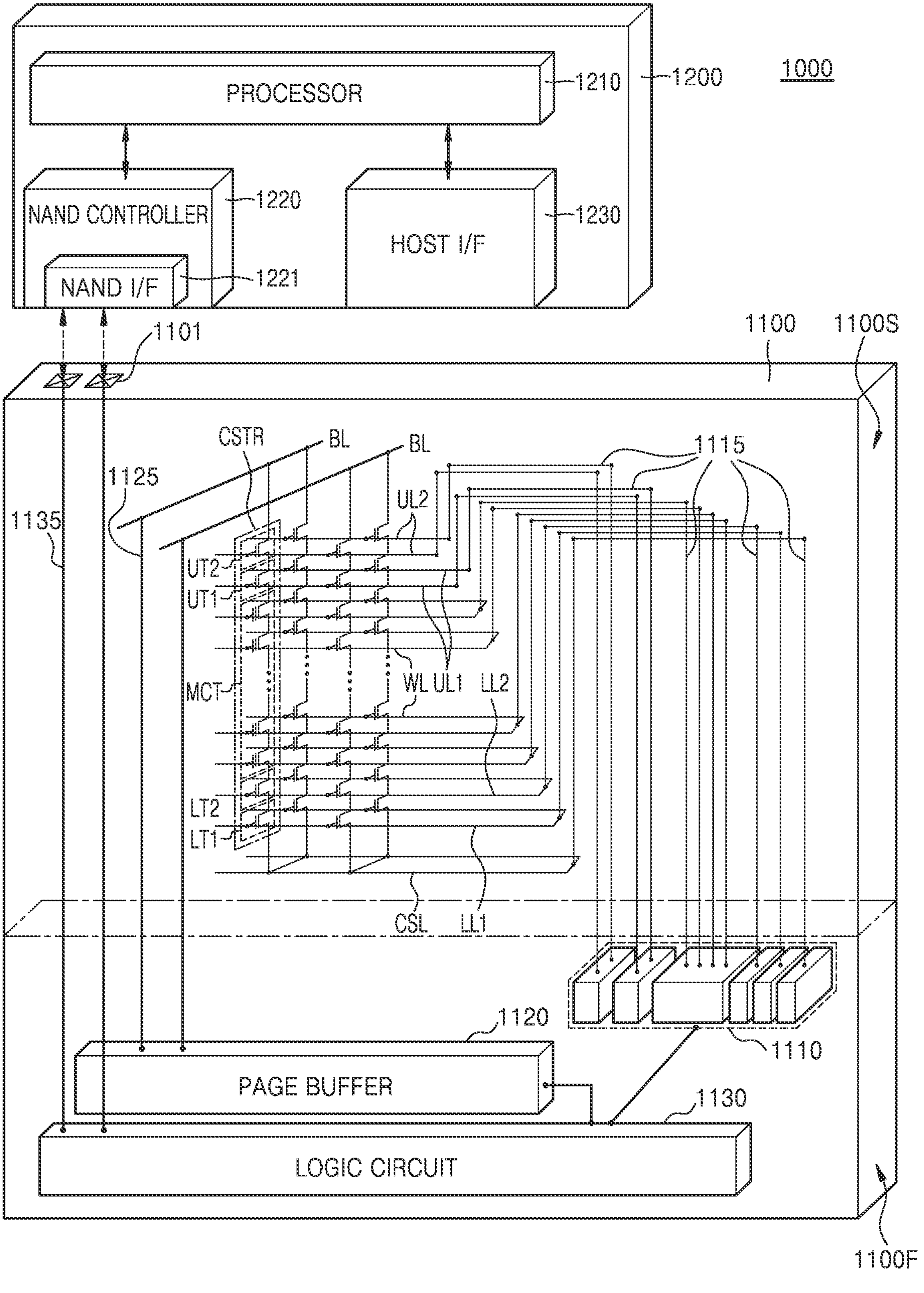
FIG. 13 is a schematic diagram of an electronic system including an IC device according to some embodiments.

FIG. 13 is a schematic diagram of an electronic system 1000 including an IC device 1100 according to some embodiments.

Referring to FIG. 13, the electronic system 1000 according to an embodiment may include the IC device 1100 and a controller 1200 electrically connected to the IC device 1100. The electronic system 1000 may be a storage device including one or a plurality of IC devices 1100 or an electronic device including the storage device. For example, the electronic system 1000 may include a solid state drive device (SSD) including at least one IC device, a universal serial bus (USB), a computing system, a medical device, or a communication device.

The IC device 1100 may be a nonvolatile memory device. For example, the IC device 1100 may include a NAND flash memory device including at least one of the structures of the IC devices 100, 100*a*, 100*b*, 100*c*, 100*d*, 100*e*, 100*f*, 100*g*, 102, 102*a*, 102*b*, 102*c*, 300, and 400 described above with reference to FIGS. 4 to 12. The IC device 1100 may include a first structure 1100F and a second structure 1100S on the first structure 1100F. In embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the memory cell strings CSTR may include lower transistors LT1 and LT2 adjacent to the common source line CSL, upper transistors UT1 and UT2 adjacent to the bit line BL, and a plurality of memory cell transistors MCT located between the lower transistors LT1 and LT2 and the upper transistors UT1 and UT2. The number of lower transistors LT1 and LT2 and the number of upper transistors UT1 and UT2 may be variously modified according to embodiments.

In embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2.

The common source line CSL, the gate lower lines LL1 and LL2, the word lines WL, and the gate upper lines UL1 and UL2 may be electrically connected to the decoder circuit 1110 through a plurality of first connection wirings 1115 extending from the first structure 1100F to the second structure 1100S. The bit lines BL may be electrically connected to the page buffer 1120 through a plurality of second connection wirings 1125 extending from the first structure 1100F to the second structure 1100S.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The IC device 1100 may communicate with the controller 1200 through the I/O pad 1101 electrically connected to the logic circuit 1130. The I/O pad 1101 may be electrically connected to the logic circuit 1130 through an I/O connection wiring 1135 extending from the first structure 1100F to the second structure 1100S.

The controller 1200 may include a processor 1210, a NAND controller 1220, and a host interface 1230. According to embodiments, the electronic system 1000 may include a plurality of IC devices 1100, and in this case, the controller 1200 may control the IC devices 1100.

The processor 1210 may control the overall operation of the electronic system 1000 including the controller 1200. The processor 1210 may operate according to certain firmware and may access the IC device by controlling the NAND controller 1220. The NAND controller 1220 may include a NAND interface 1221 that handles communication with the IC device. Through the NAND interface 1221, a control command for controlling the IC device, data to be written to the memory cell transistors MCT of the IC device, and data to be read from a plurality of memory cell transistors MCT of the IC device may be transmitted. The host I/F 1230 may provide a communication function between the electronic system 1000 and an external host. When a control command is received from an external host through the host I/F 1230, the processor 1210 may control the IC device in response to the control command.

Figure 14:
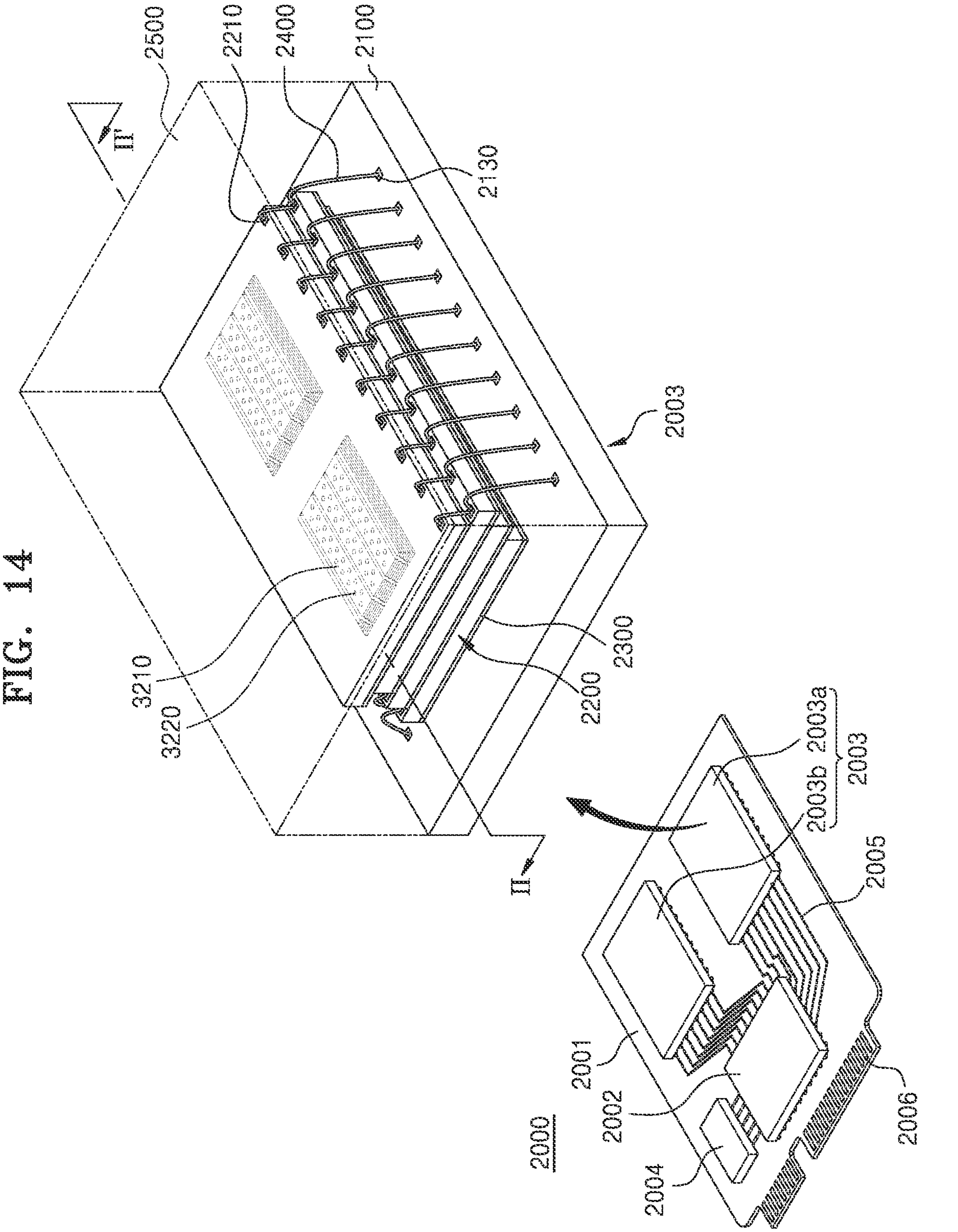
FIG. 14 is a perspective view schematically illustrating an electronic system including an IC device according to some embodiments.

FIG. 14 is a perspective view schematically illustrating an electronic system 2000 including an IC device according to some embodiments.

Referring to FIG. 14, the electronic system 2000 according to an embodiment may include a main substrate 2001 and a controller 2002, one or more semiconductor packages 2003, and DRAM 2004 mounted on the main substrate 2001. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host. The number and arrangement of the pins of the connector 2006 may vary depending on a communication interface between the electronic system 2000 and the external host. In embodiments, the electronic system 2000 may communicate with an external host according to any one of interfaces such as a universal serial bus (USB), a peripheral component interconnect express (PCI-Express), a serial advanced technology attachment (SATA), M-Phy for a universal flash storage (UFS), etc. In embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the electronic system 2000.

The DRAM 2004 may be a buffer memory for mitigating a speed difference between the semiconductor package 2003 as a data storage space and the external host. The DRAM 2004 included in the electronic system 2000 may also operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including a plurality of package upper pads 2130. Each of the semiconductor chips 2200 may include an I/O pad 2210. The I/O pad 2210 may correspond to the I/O pad 1101 of FIG. 13. Each of the semiconductor chips 2200 may include a plurality of gate stacks 3210 and a plurality of channel structures 3220. Each of the semiconductor chips 2200 may include at least one of the structures of the IC devices 100, 100*a*, 100*b*, 100*c*, 100*d*, 100*e*, 100*f*, 100*g*, 102, 102*a*, 102*b*, 102*c*, 300, 400 described above with reference to FIGS. 4 to 12.

In embodiments, the connection structure 2400 may be a bonding wire electrically connecting the I/O pad 2210 to the package upper pad 2130. Accordingly, in the first and second semiconductor packages 2003*a* and 2003*b*, the semiconductor chips 2200 may be electrically connected to each other by a bonding wire method, and may be electrically connected to the package upper pad 2130 of the package substrate 2100. In embodiments, in the first and second semiconductor packages 2003*a* and 2003*b*, the semiconductor chips 2200 may be electrically connected to each other by a connection structure including a through-silicon via (TSV), instead of the bonding wire type connection structures 2400.

In embodiments, the controller 2002 and the semiconductor chips 2200 may be included in a single package. In embodiments, the controller 2002 and the semiconductor chips 2200 may be mounted on a separate interposer substrate different from the main substrate 2001, and the controller 2002 may be connected to the semiconductor chips 2200 by a wiring formed on the interposer substrate.

Figure 15:
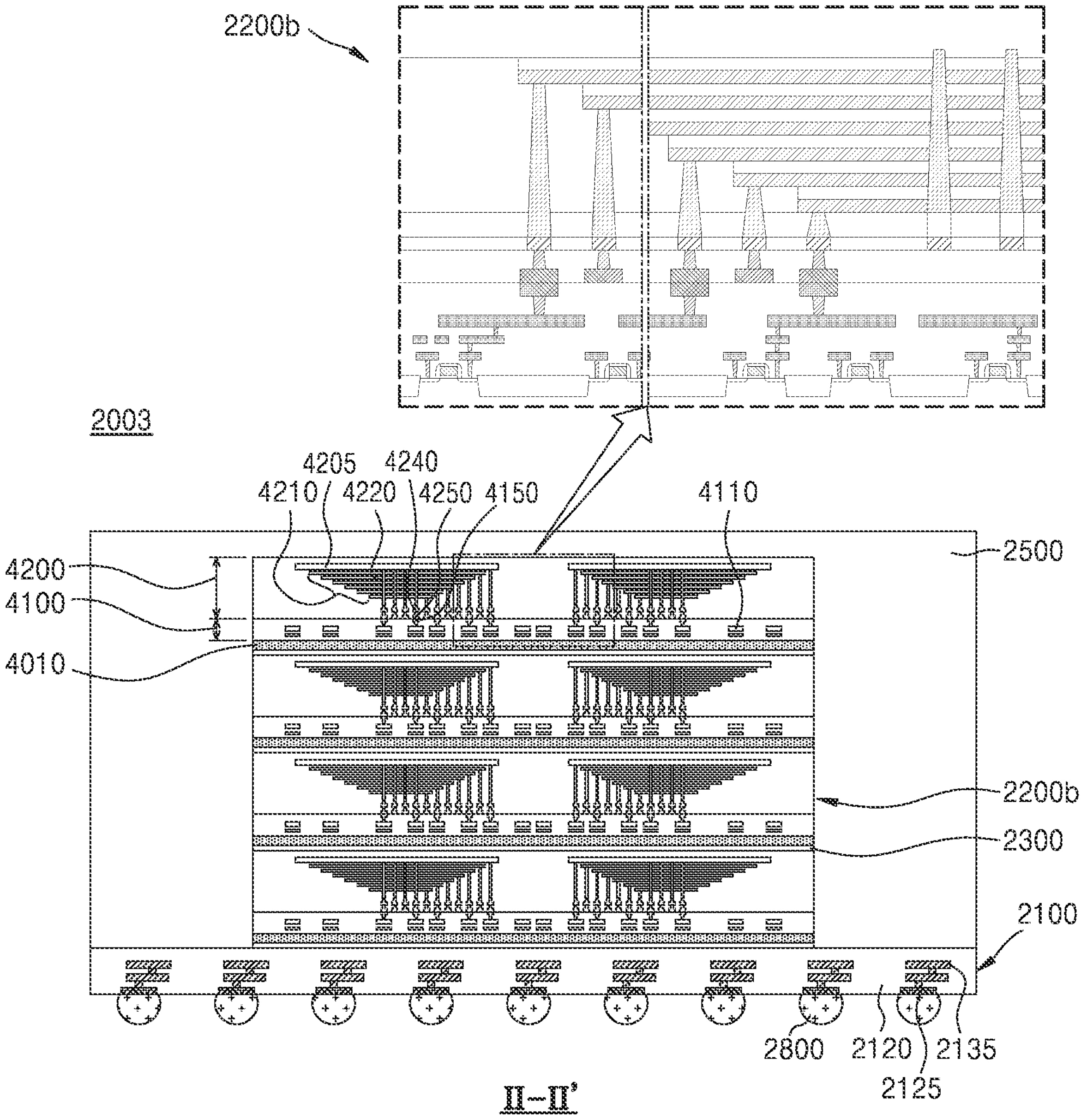
FIG. 15 is a schematic cross-sectional view of semiconductor packages according to some embodiments.

FIG. 15 is a schematic cross-sectional view of semiconductor packages according to some embodiments. FIG. 15 shows a configuration taken along line II-II' of FIG. 14 in detail.

Referring to FIG. 15, in a semiconductor package 2003, each of semiconductor chips 2200*b* may include a semiconductor substrate 4010, a first structure 4100 on the semiconductor substrate 4010, and a second structure 4200 bonded to the first structure 4100 on the first structure 4100 in a wafer bonding manner. Each of the semiconductor chips 2200*b* may include at least one of the structures of the IC devices 100, 100*a*, 100*b*, 100*c*, 100*d*, 100*e*, 100*f*, 100*g*, 102, 102*a*, 102*b*, 102*c*, 300, and 400 described above with reference to FIGS. 4 to 12.

The first structure 4100 may include a peripheral circuit region including a peripheral wiring 4110 and first junction structures 4150. The second structure 4200 may include a common source line 4205, a gate stack structure 4210 between the common source line 4205 and the first structure 4100, memory channel structures 4220 passing through the gate stack structure 4210, and second junction structures 4250 electrically connected to the memory channel structures 4220 and word lines (WL of FIG. 13) of the gate stack structure 4210. For example, the second junction structures 4250 may be electrically connected to the memory channel structures 4220 and the word lines (WL of FIG. 13) through bit lines 4240 electrically connected to the memory channel structures 4220 and gate connection wirings electrically connected to the word lines (WL in FIG. 13). The first junction structures 4150 of the first structure 4100 may be bonded to and contact the second junction structures 4250 of the second structure 4200. Bonded portions of the first junction structures 4150 and the second junction structures 4250 may include, for example, copper (Cu).

Each of the semiconductor chips 2200*b* may further include I/O pads (2210 of FIG. 14) electrically connected to the peripheral wirings 4110 of the first structure 4100.

The semiconductor chips 2200 of FIG. 14 may be electrically connected to the semiconductor chips 2200*b* of FIG. 15 by connection structures 2400 in the form of bonding wires. However, in embodiments, semiconductor chips in one semiconductor package, such as the semiconductor chips 2200 of FIG. 14 and the semiconductor chips 2200*b* of FIG. 15, are connected by a connection structure including a through-electrode (TSV). They may be electrically connected to each other.

While various embodiments have been particularly shown and described above with reference to the drawings, it will be understood that various changes in form and details may be made therein without departing from the spirit and scope of the following claims.

What is claimed is:

1. An integrated circuit device comprising:

a substrate including an active region comprising a central active region, at least two base active regions and at least two extended active regions that are integrated together and defined by a device isolation film, a drain region being located in the central active region, source regions being respectively located in the at least two base active regions, the at least two base active regions being spaced apart from each other in different diagonal directions with respect to the central active region in a plan view, wherein the at least two extended active regions each have an L-shape, connect the central active region and the at least two base active regions, and are spaced apart from each other; and at least two gate structures that respectively cross the at least two base active regions, extend in a first horizontal direction, and are spaced apart from each other on the substrate, wherein the central active region, the at least two extended active regions, the at least two base active regions, and the at least two gate structures configure at least two pass transistors, and the at least two pass transistors share the drain region.

2. The integrated circuit device of claim 1, wherein the at least two extended active regions have a horizontal width that is less than a horizontal width of the at least two base active regions in the first horizontal direction and the at least two extended active regions extend to connect the central active region to the at least two base active regions.

3. The integrated circuit device of claim 1, wherein the at least two gate structures do not overlap the central active region in a vertical direction and do not overlap the at least two extended active regions in the vertical direction.

4. The integrated circuit device of claim 1, wherein the at least two extended active regions include:

connection extended active regions respectively extending from the at least two base active regions in a second horizontal direction orthogonal to the first horizontal direction, and refraction extended active regions extending from the connection extended active regions in the first horizontal direction to be connected to the central active region.

5. The integrated circuit device of claim 4, wherein the at least two gate structures do not overlap the central active region and the refraction extended active regions of the at least two extended active regions in a vertical direction but overlap a portion of the connection extended active regions of the at least two extended active regions in the vertical direction.

6. The integrated circuit device of claim 1, wherein:

the at least two base active regions include a first base active region, a second base active region, a third base active region, and a fourth base active region, the at least two extended active regions include a first extended active region, a second extended active region, a third extended active region, and a fourth extended active region, the first extended active region, the second extended active region, the third extended active region, and the fourth extended active region respectively include a first connection extended active region, a second connection extended active region, a third connection extended active region, and a fourth connection extended active region respectively connected to the first base active region, the second base active region, the third base active region, and the fourth base active region and extending in a second horizontal direction, and the first extended active region, the second extended active region, the third extended active region, and the fourth extended active region respectively include a first refraction extended active region, a second refraction extended active region, a third refraction extended active region, and a fourth refraction extended active region respectively extending from the first connection extended active region, the second connection extended active region, the third connection extended active region, and the fourth connection extended active region in the first horizontal direction to be connected to the central active region, and the at least two gate structures include a first gate structure, a second gate structure, a third gate structure, and a fourth gate structure respectively crossing the first base active region, the second base active region, the third base active region, and the fourth base active region.

7. The integrated circuit device of claim 6, wherein:

the first base active region and the third base active region are spaced apart from the second base active region and the fourth base active region in the first horizontal direction, and the first base active region and the second base active region are spaced apart from the third base active region and the fourth base active region in the second horizontal direction, the first extended active region and the second extended active region are linearly symmetrical to the third extended active region and the fourth extended active region based on an imaginary first straight line passing through a center of the central active region and extending in the second horizontal direction, and the first extended active region and the third extended active region are linearly symmetrical to the second extended active region and the fourth extended active region based on an imaginary second straight line passing through the center of the central active region and extending in the first horizontal direction.

8. The integrated circuit device of claim 6, further comprising:

a first field relaxation gate structure, a second field relaxation gate structure, a third field relaxation gate structure, and a fourth field relaxation gate structure that respectively cross the first extended active region, the second extended active region, the third extended active region, and the fourth extended active region, extend in the first horizontal direction, and are spaced apart from each other on the substrate, wherein the central active region, the first extended active region, the second extended active region, the third extended active region, and the fourth extended active region, and the first field relaxation gate structure, the second field relaxation gate structure, the third field relaxation gate structure, and the fourth field relaxation gate structure configure a first field relaxation transistor, a second field relaxation transistor, a third field relaxation transistor, and a fourth field relaxation transistor.

9. The integrated circuit device of claim 8, wherein the first field relaxation gate structure, the second field relaxation gate structure, the third field relaxation gate structure, and the fourth field relaxation gate structure are arranged to respectively overlap the first refraction extended active region, the second refraction extended active region, the third refraction extended active region, and the fourth refraction extended active region in a vertical direction.

10. The integrated circuit device of claim 6, further comprising:

an isolation region located below the device isolation film in the substrate;

wherein the isolation region includes a base isolation region surrounding the active region and a first extended isolation region and a second extended isolation region respectively extending from opposite portions of the base isolation region, the first extended isolation region extending between the first base active region and the third base active region in a second horizontal direction and the second extended isolation region extending between the second base active region and the fourth base active region in the second horizontal direction.

11. An integrated circuit device comprising:

a peripheral circuit structure; and a cell array structure including a cell stack structure overlapping the peripheral circuit structure in a vertical direction, the cell stack structure including a plurality of gate electrodes and a plurality of insulating layers alternately stacked on each other and having a step shape, wherein the peripheral circuit structure includes:

a substrate including an active region in which a central active region, first, second, third, and fourth base active regions, and first, second, third, and fourth extended active regions are integrally formed, the active region being defined by a device isolation film, the first, second, third, and fourth base active regions being spaced apart from each other in different diagonal directions with respect to the central active region in a plan view, and the first, second, third, and fourth extended active regions being spaced apart from each other and connecting the central active region to the first, second, third, and fourth base active regions; and first, second, third, and fourth gate structures that respectively cross the first, second, third, and fourth base active regions, that extend in a first horizontal direction, and that are spaced apart from each other on the substrate, wherein the central active region, the first, second, third, and fourth extended active regions, the first, second, third, and fourth base active regions, and the first, second, third, and fourth gate structures configure first, second, third, and fourth pass transistors electrically connected to the plurality of gate electrodes.

12. The integrated circuit device of claim 11, wherein the first, second, third, and fourth extended active regions have a horizontal width that is less than a horizontal width of the first, second, third, and fourth base active regions in the first horizontal direction and extend to have an L-shape to connect the central active region to the first, second, third, and fourth base active regions.

13. The integrated circuit device of claim 12, wherein the active region has first, second, third, and fourth reduction holes extending in the first horizontal direction and which are delimited between the first, second, third, and fourth base active regions and the first, second, third, and fourth extended active regions.

14. The integrated circuit device of claim 13, wherein the active region has a first shared hole and a second shared hole, the first shared hole is delimited by the first and third extended active regions and the central active region and extends in the first horizontal direction, and the second shared hole is delimited by the second and fourth extended active regions and the central active region and extends in the first horizontal direction.

15. The integrated circuit device of claim 11, further comprising:

first, second, third, and fourth field relaxation gate structures that respectively cross the first, second, third, and fourth extended active regions, extend in the first horizontal direction, and are spaced apart from each other on the substrate, wherein the central active region, the first, second, third, and fourth extended active regions, and the first, second, third, and fourth field relaxation gate structures configure first, second, third, and fourth field relaxation transistors.

16. The integrated circuit device of claim 11, further comprising:

first, second, third, and fourth source regions respectively located in the first, second, third, and fourth base active regions; and a drain region located in the central active region, wherein the first, second, third, and fourth pass transistors share the drain region.

17. The integrated circuit device of claim 16, wherein the plurality of gate electrodes are electrically connected to the drain region.

18. An electronic system comprising:

a main substrate;

an integrated circuit device on the main substrate, the integrated circuit device including a peripheral circuit structure and a cell array structure, wherein the cell array structure includes a cell stack structure that overlaps the peripheral circuit structure in a vertical direction, that includes a plurality of gate electrodes and a plurality of insulating layers alternately stacked on each other, and that has a step shape; and a controller electrically connected to the integrated circuit device on the main substrate, wherein the peripheral circuit structure includes:

a periphery substrate including an active region in which a central active region, first, second, third, and fourth base active regions, and first, second, third, and fourth extended active regions are integrally formed, a drain region being located in the central active region and first, second, third, and fourth source regions being respectively located in the first, second, third, and fourth base active regions, the active region being defined by a device isolation film, the first, second, third, and fourth base active regions being arranged and spaced apart from each other in different diagonal directions with respect to the central active region in a plan view, and the first, second, third, and fourth extended active regions connecting the central active region to the first, second, third, and fourth base active regions and being spaced apart from each other; and first, second, third, and fourth gate structures that respectively cross the first, second, third, and fourth base active regions, extend in a first horizontal direction, and are spaced apart from each other on the periphery substrate, wherein the central active region, the first, second, third, and fourth extended active regions, the first, second, third, and fourth base active regions, and the first, second, third, and fourth gate structures configure first, second, third, and fourth pass transistors electrically connected to the plurality of gate electrodes.

19. The electronic system of claim 18, wherein the first, second, third, and fourth pass transistors share the drain region, and the plurality of gate electrodes are electrically connected to the drain region.

20. The electronic system of claim 18, wherein the first, second, third, and fourth extended active regions have a horizontal width that is less than a horizontal width of the first, second, third, and fourth base active regions in the first horizontal direction, and extend to have an L-shape to connect the central active region to the first, second, third, and fourth base active regions.

* * * * *